(12) United States Patent
Sato

(10) Patent No.: US 9,187,315 B2
(45) Date of Patent: Nov. 17, 2015

(54) METHOD FOR MANUFACTURING SEMICONDUCTOR DEVICE

(71) Applicant: Mitsubishi Electric Corporation, Tokyo (JP)

(72) Inventor: Kimitoshi Sato, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/449,633

(22) Filed: Aug. 1, 2014

(65) Prior Publication Data

US 2015/0191347 A1 Jul. 9, 2015

(30) Foreign Application Priority Data

Jan. 8, 2014 (JP) .................................. 2014-001745

(51) Int. Cl.
*H01L 21/00* (2006.01)
*B81C 1/00* (2006.01)

(52) U.S. Cl.
CPC .................................. *B81C 1/00166* (2013.01)

(58) Field of Classification Search
CPC ................ H01L 31/022425; H01L 331/02168
See application file for complete search history.

(56) References Cited

U.S. PATENT DOCUMENTS

| 5,258,097 A |  | 11/1993 | Mastrangelo |  |
|---|---|---|---|---|
| 5,431,057 A | * | 7/1995 | Zimmer et al. | 73/724 |
| 5,824,608 A | * | 10/1998 | Gotoh et al. | 438/745 |
| 6,167,761 B1 |  | 1/2001 | Hanzawa et al. |  |
| 6,472,243 B2 | * | 10/2002 | Gogoi et al. | 438/50 |
| 6,640,642 B1 |  | 11/2003 | Onose et al. |  |
| 6,892,582 B1 |  | 5/2005 | Satou et al. |  |
| 7,429,495 B2 | * | 9/2008 | Wan | 438/53 |
| 2002/0072144 A1 |  | 6/2002 | Gogoi et al. |  |
| 2003/0215974 A1 |  | 11/2003 | Kawasaki et al. |  |
| 2014/0159122 A1 |  | 6/2014 | Sato |  |

FOREIGN PATENT DOCUMENTS

| CN | 201410100511.0 | 4/2014 |
|---|---|---|
| CN | 103872050 A | 6/2014 |
| JP | H07-007161 A | 1/1995 |
| JP | H11-281509 A | 10/1999 |
| JP | 2001-235382 A | 8/2001 |
| JP | 2003-332587 A | 11/2003 |
| JP | 4267322 B2 | 2/2009 |
| WO | 01/14842 A1 | 3/2001 |

* cited by examiner

*Primary Examiner* — Zandra Smith
*Assistant Examiner* — Andre' C Stevenson
(74) *Attorney, Agent, or Firm* — Studebaker & Brackett PC

(57) ABSTRACT

A method for manufacturing a semiconductor device includes: simultaneously forming first and second well regions on a semiconductor substrate, wherein the second well region becomes a fixed electrode; simultaneously forming a first gate insulating film on the first well region and a fixed electrode protective film on the second well region; simultaneously forming a floating gate electrode on the first gate insulating film and a sacrificial film on the fixed electrode protective film; simultaneously forming a second gate insulating film on the floating gate electrode and a movable electrode protective film on the sacrificial film; simultaneously forming a gate electrode on the second gate insulating film and a movable electrode on the movable electrode protective film; removing the sacrificial film to form a void by; and vacuum-sealing the void to form a vacuum chamber.

17 Claims, 24 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device wherein a MOS (Metal Oxide Semiconductor) structure and a semiconductor pressure sensor are integrated.

2. Background Art

In recent years, semiconductor pressure sensors are used in various fields including automobiles. An example of semiconductor pressure sensors is a semiconductor pressure sensor integrated on a CMOS (Complementary Metal Oxide Semiconductor) circuit. A CMOS integrated pressure sensor is proposed which aims to achieve further size reduction, lower cost and higher accuracy (e.g., see Japanese Patent No. 4267322)

In this conventional semiconductor pressure sensor, a region in which a CMOS circuit is formed (MOS region) and a region in which a pressure sensor is formed (pressure sensor region) are defined on a semiconductor substrate. In the MOS region, a CMOS circuit is formed which includes an n-channel type MOS transistor and a p-channel type MOS transistor. In the pressure sensor region, a capacitative pressure sensor is formed. In the capacitative pressure sensor, a fixed electrode and a movable electrode are formed, and a vacuum chamber is provided between a fixed electrode and a movable electrode. The vacuum chamber is sealed with a sealing film. The pressure is measured by detecting a change in the distance between the movable electrode and the fixed electrode as a change in the capacitance value.

SUMMARY OF THE INVENTION

Conventionally, a step of forming a pressure sensor is a step different from the step of forming a CMOS circuit. That is, a step of forming a sacrificial film to form a vacuum chamber, a step of forming a movable electrode and a step of forming a sealing film to seal the vacuum chamber are added to the CMOS process as dedicated steps for forming the pressure sensor. When removing the sacrificial film by etching, it is necessary to form a protective film to protect the MOS region before that step, remove the sacrificial film and then remove the protective film. This results in a problem of the process steps becoming long and complicated.

Moreover, the vacuum chamber disposed below the movable electrode is formed before the process of the MOS region ends. Thus, it is necessary to take measures for sticking through wet processing or the like so that the movable electrode is not stuck. This causes a problem that care is required when handling the sensor section in the process.

In view of the above-described problems, an object of the present invention is to provide a method for manufacturing a semiconductor device which can facilitate manufacturing.

According to the present invention, a method for manufacturing a semiconductor device includes: simultaneously forming first and second well regions on a semiconductor substrate, wherein the second well region becomes a fixed electrode; simultaneously forming a first gate insulating film on the first well region and a fixed electrode protective film on the second well region; simultaneously forming a floating gate electrode on the first gate insulating film and a sacrificial film on the fixed electrode protective film; simultaneously forming a second gate insulating film on the floating gate electrode and a movable electrode protective film on the sacrificial film; simultaneously forming a gate electrode on the second gate insulating film and a movable electrode on the movable electrode protective film; removing the sacrificial film to form a void by; and vacuum-sealing the void to form a vacuum chamber.

In the present invention, achieving commonality between the MOS structure forming process and the pressure sensor forming process can facilitate manufacturing.

Other and further objects, features and advantages of the invention will appear more fully from the following description.

DETAILED DESCRIPTION OF THE PREFERRED EMBODIMENTS

Figure 1:
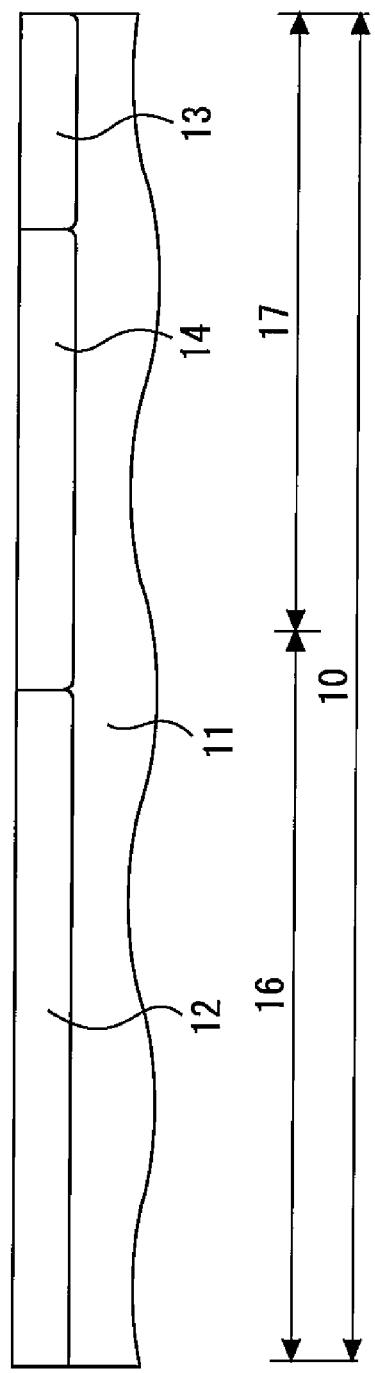
FIGS. 1 to 13 are cross-sectional views illustrating a method according to an embodiment of the present invention.

FIGS. 1 to 13 are cross-sectional views illustrating a method according to an embodiment of the present invention. As shown in FIG. 1, a silicon substrate 11 of a semiconductor device 10 includes a pressure sensor region 16 in which a pressure sensor is formed and a MOS region 17 in which a CMOS (Complementary Metal Oxide Semiconductor) circuit is formed. An n-type well region 12 is formed in the pressure sensor region 16 and an n-type well region 13 and a p-type well region 14 are formed in the MOS region 17 on the surface of this silicon substrate 11. The well region 12 of the pressure sensor region 16 functions as a fixed electrode of the pressure sensor.

More specifically, a silicon oxide film and a silicon nitride film (not shown) are formed in that order so as to cover the p-type silicon substrate 11. Next, a resist mask (not shown) is formed in which a region where an NMOS (Negative Channel Metal Oxide Semiconductor) of the MOS region is opened and etching processing is applied using this resist mask as an etching mask and the silicon nitride film of the region in which the NMOS is formed is removed. Using this resist mask as an injection mask, p-type impurity (e.g., boron) for forming the well region 14 is injected. Then, the resist mask is removed.

Next, a relatively thick silicon oxide film (not shown) is formed on the surface of the well region 14 from which the silicon nitride film has been removed by applying thermal oxidation processing. Next, the silicon nitride film is removed. Next, using the silicon oxide film as an injection mask, n-type impurity (e.g., phosphor) is injected to form the well region 12 of the pressure sensor region and the well region 13 of the MOS region.

Next, by applying annealing processing under a predetermined condition, the injected p-type impurity and n-type impurity are activated and diffused. After that, the silicon oxide film which remains on the surface of the silicon substrate 11 is removed.

Figure 2:
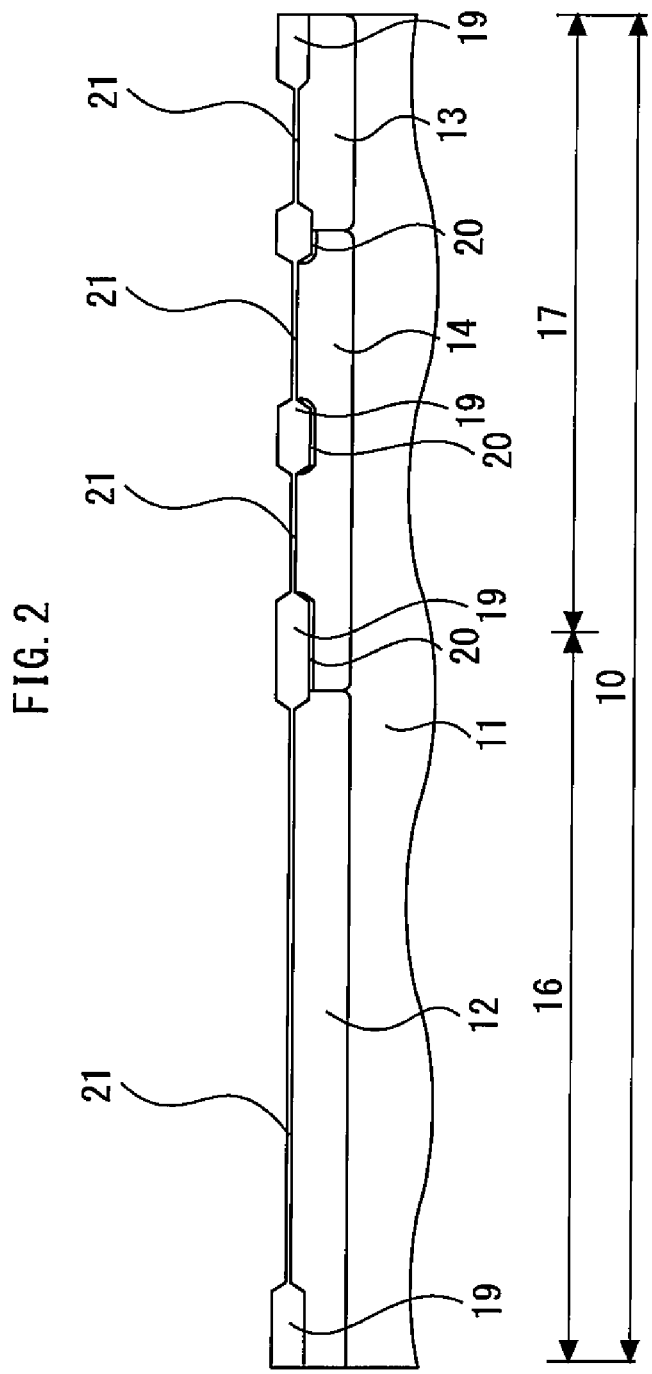

Next, as shown in FIG. 2, a field oxide film 19 is formed in the pressure sensor region 16 and the MOS region 17 using a LOCOS (Local Oxidation of Silicon) method. The film thickness of the field oxide film 19 is on the order of 0.2 to 1.0 µm. An underlay oxide film 21 is formed on the surfaces of the well region 12, the well region 13 and the well region 14. A semiconductor element such as MOS transistor formed in a region defined by the field oxide film 19 is electrically insulated by the field oxide film 19 and a field dopant 20 formed right therebelow.

More specifically, the underlay oxide film 21, a polysilicon film (not shown) and a silicon nitride film (not shown) are formed in that order on the surface of the silicon substrate 11. Next, by applying predetermined photoengraving processing, a resist mask (not shown) for forming the field oxide film 19 is formed. By applying etching processing using this resist mask as an etching mask, the silicon nitride film is removed from the portion in which the field oxide film 19 is formed. After that, the resist mask is removed. Next, a resist mask (not shown) is formed to form a field dopant through photoengraving processing again. Using this resist mask as an injection mask, p-type impurity (e.g., boron) is injected in the portion which becomes the field dopant. After that, the resist mask is removed.

Next, by applying oxidation processing under a predetermined condition, the portion from which the silicon nitride film has been removed is locally oxidized and the field oxide film 19 is formed. At this time, the injected p-type impurity is activated and the field dopant 20 is formed. Then, the remaining silicon nitride film is removed.

Figure 3:
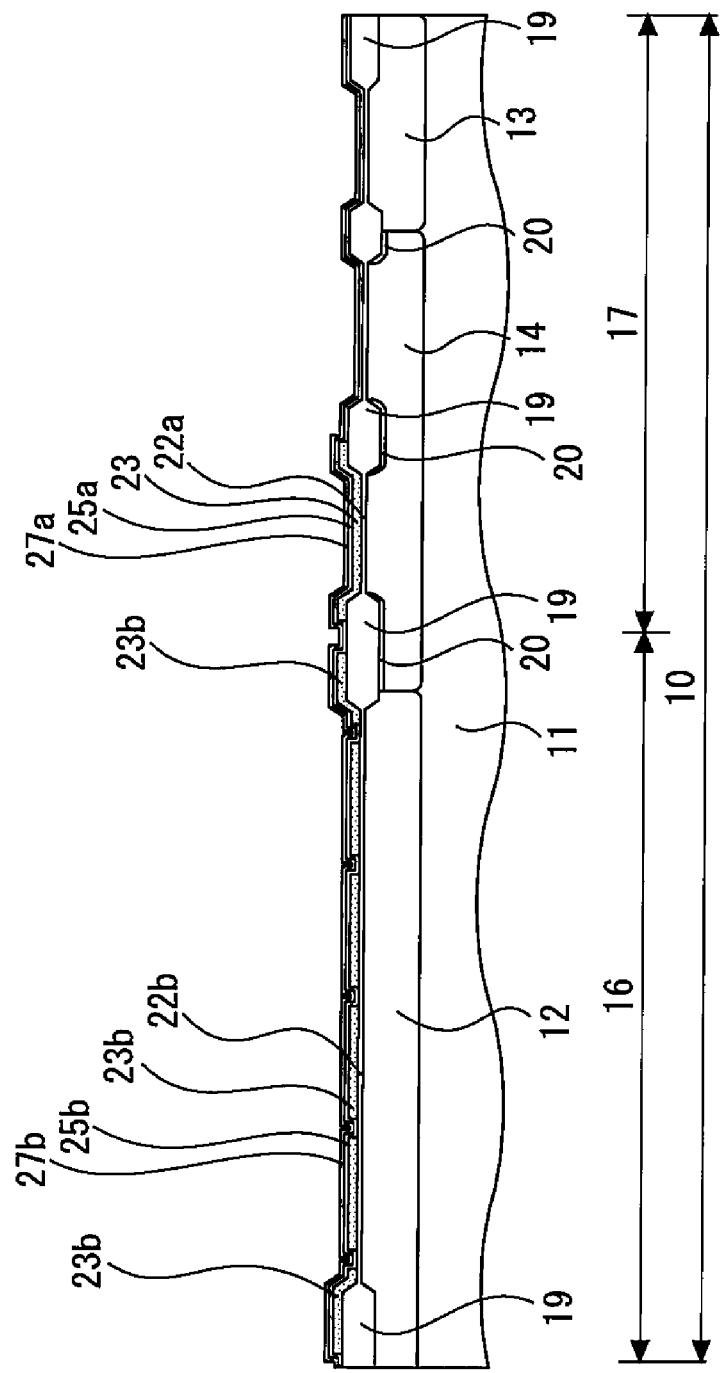

Next, as shown in FIG. 3, a sacrificial film 23b in the pressure sensor region 16 and an EPROM (Erasable Programmable Read Only Memory) floating gate electrode 23 in the MOS region 17 are simultaneously formed using the same material. More specifically, thermal oxidation processing is applied to the silicon substrate 11 from which the underlay oxide film 21 has been removed to thereby simultaneously form a first gate oxide film 22a (film thickness of on the order of 5 to 30 nm) on the surface of the exposed silicon substrate 11 in the MOS region 17 and a fixed electrode protective film 22b on the surface of the exposed silicon substrate 11 in the pressure sensor region 16. This fixed electrode protective film 22b becomes a protective film of the well region 12 which becomes the fixed electrode when the sacrificial film which will be described later is removed by etching and the first gate oxide film 22a becomes an EPROM gate oxide film to be formed in the MOS region 17.

Next, a polysilicon film (not shown) is formed using a CVD (Chemical Vapor Deposition) method so as to cover the first gate oxide film 22a and the fixed electrode protective film 22b. Phosphor is introduced during or immediately after forming this polysilicon film using a well-known method so as to obtain conductivity as the n-type polysilicon film. Next, by applying photoengraving processing, a resist mask (not shown) is formed to pattern the sacrificial film and the floating gate. By applying predetermined etching processing thereto using this resist mask as an etching mask, the polysilicon film is patterned, the sacrificial film 23b is formed in the pressure sensor region 16 and the EPROM floating gate electrode 23 (film thickness of on the order of 50 to 300 nm) is formed in the MOS region 17. As will be described later, by removing this sacrificial film 23b, a vacuum chamber is formed. After that, the resist mask is removed.

Next, for example, a thermal oxidation method is used to simultaneously form a second gate oxide film 25a (film thickness of on the order of 5 to 30 nm) so as to cover the floating gate electrode 23 in the MOS region 17 and a first movable electrode protective film 25b so as to cover the sacrificial film 23b in the pressure sensor region 16. Next, a CVD method is used to simultaneously form a first silicon nitride film 27a (film thickness of on the order of 5 to 30 nm) so as to cover the second gate oxide film 25a in the MOS region 17 and a second movable electrode protective film 27b in the pressure sensor region 16. The first movable electrode protective film 25b and the second movable electrode protective film 27b become protective films for the movable electrode when removing the sacrificial film through etching processing. The movable electrode will be described later.

Thus, the fixed electrode protective film 22b that protects the well region 12 which becomes the fixed electrode and the first gate oxide film 22a are simultaneously formed. The sacrificial film 23b which becomes a vacuum chamber and the EPROM floating gate electrode 23 are simultaneously formed. The first movable electrode protective film 25b that protects the movable electrode and the second gate oxide film 25a are formed simultaneously. The second movable electrode protective film 27b that protects the movable electrode and the first silicon nitride film 27a are formed simultaneously. This eliminates the necessity for a dedicated step of forming a pressure sensor.

Next, a resist mask (not shown) is formed to expose the well region 13 in which a p-channel type MOS transistor is formed and cover the other region. Using this resist mask as an injection mask, predetermined impurity (e.g., boron) for controlling a threshold voltage of the p-channel type MOS transistor is injected. After that, the resist mask is removed. Furthermore, a resist mask (not shown) is formed to expose the well region 14 in which an n-channel type MOS transistor is formed and cover the other region. Using this resist mask as an injection mask, predetermined impurity (e.g., boron) for controlling a threshold voltage of the n-channel type MOS transistor is injected. After that, the resist mask is removed.

Next, a resist mask (not shown) is formed to expose the well region 13 and the well region 14 in the MOS region 17 and cover the other region. Using this resist mask as an injection mask, the first gate oxide film 22a, the second gate oxide film 25a and the first silicon nitride film 27a are removed by etching to expose the surface of the silicon substrate 11. After that, the resist mask is removed.

Figure 4:
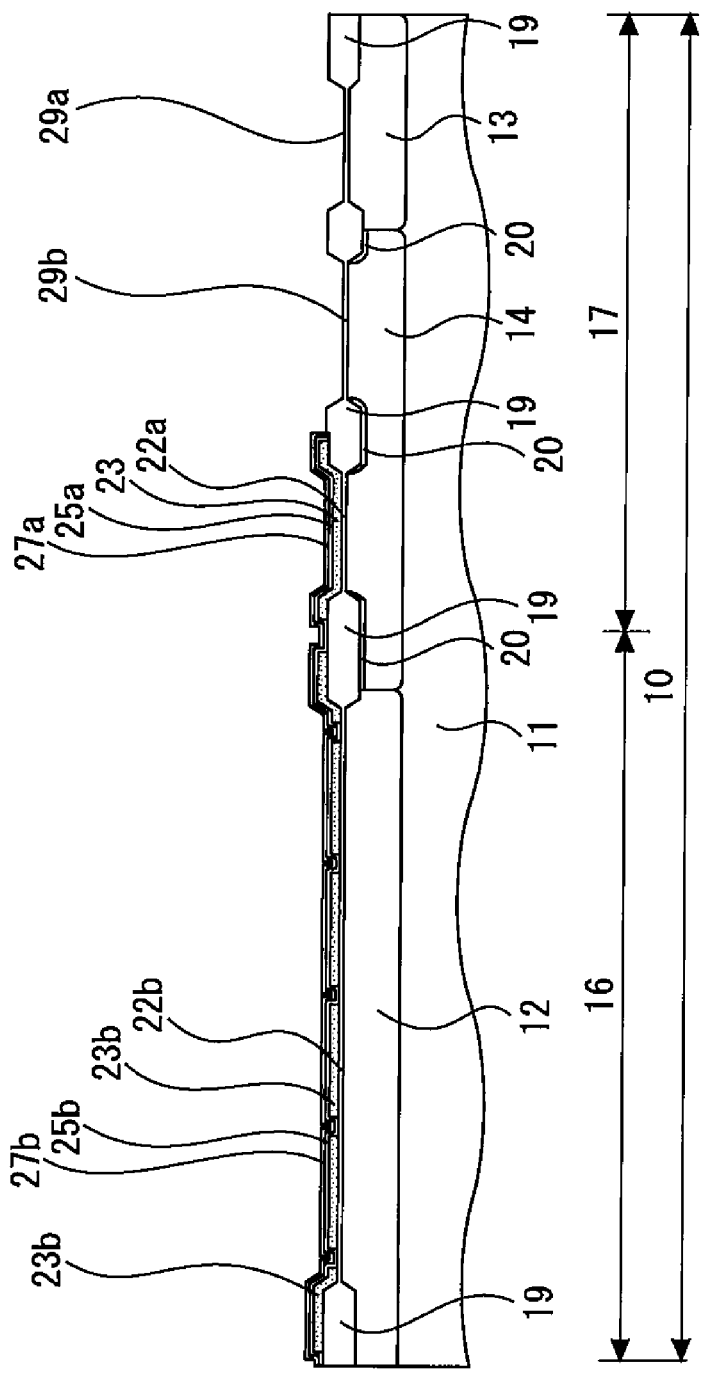

Next, as shown in FIG. 4, thermal oxidation processing is applied, a third gate oxide film 29b (film thickness of on the order of 5 to 30 nm) is formed on the surface of the well region 13, and a third gate oxide film 29a (film thickness of on the order of 5 to 30 nm) is formed on the surface of the well region 14.

Figure 5:
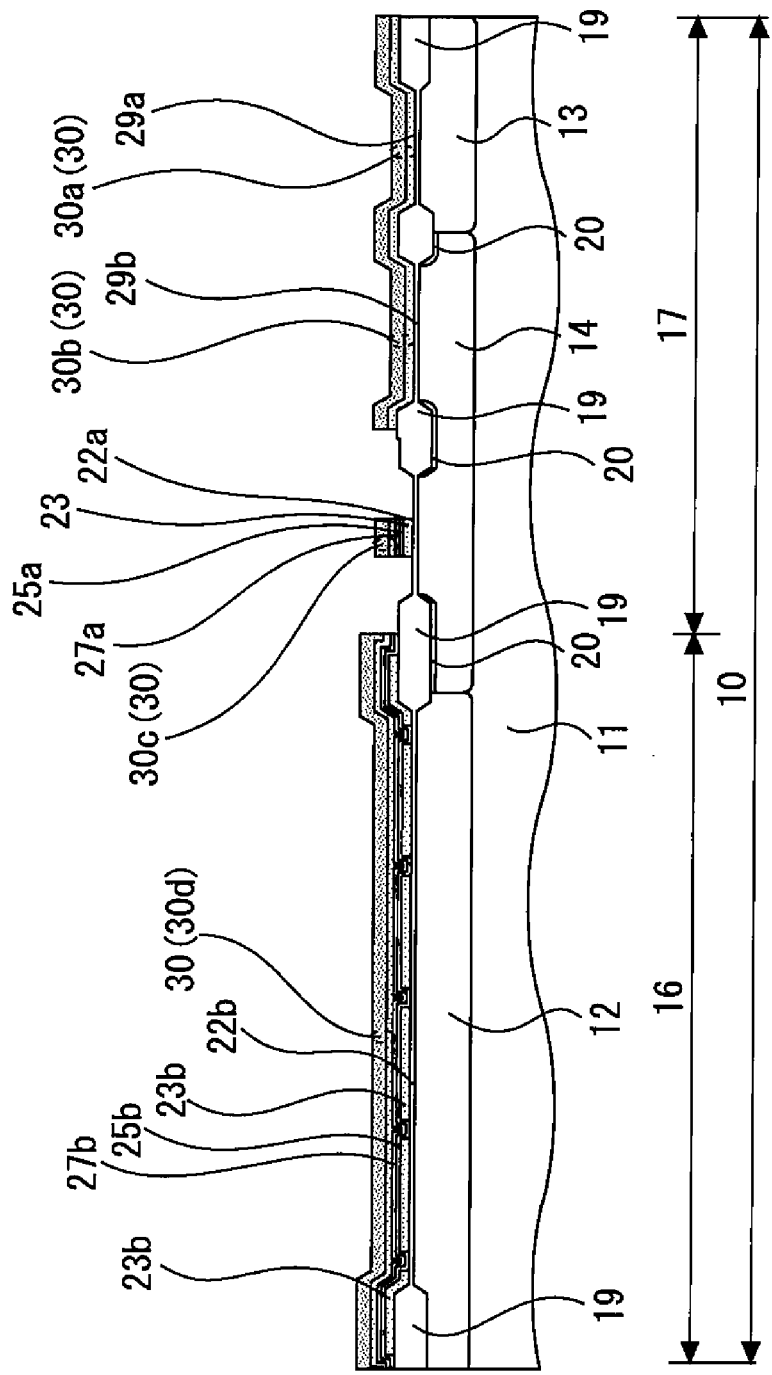

Next, as shown in FIG. 5, a movable electrode 30d in the pressure sensor region 16, gate electrodes 30a and 30b of the p-channel type and n-channel type MOS transistor and an EPROM gate electrode 30c in the MOS region 17 are formed simultaneously. More specifically, a conductive film 30 is formed so as to cover the first silicon nitride film 27a, the second movable electrode protective film 27b and the third gate oxide films 29a and 29b. This conductive film 30 is a laminated film having a two-layer structure of a polysilicon film (film thickness of on the order of 50 to 300 nm) and a tungsten silicide (WSi$_2$) film (film thickness of on the order of 50 to 300 nm), a so-called poly-side film. The polysilicon film is formed using a CVD method and is converted to an n-type polysilicon film by introducing phosphor during or immediately after the formation thereof. The tungsten silicide film is formed so as to cover the polysilicon film using a sputtering method or CVD method. The conductive film 30 may be a laminated film composed of a polysilicon film and a titanium silicide (TiSi$_2$) film.

Next, a resist mask (not shown) for patterning an EPROM gate electrode is formed. The conductive film 30 in the region in which the EPROM in the MOS region 17 is formed, the first silicon nitride film 27a, the second gate oxide film 25a and the floating gate electrode 23 are patterned by applying etching processing using this resist mask as an etching mask. After that, the resist mask is removed.

Figure 6:
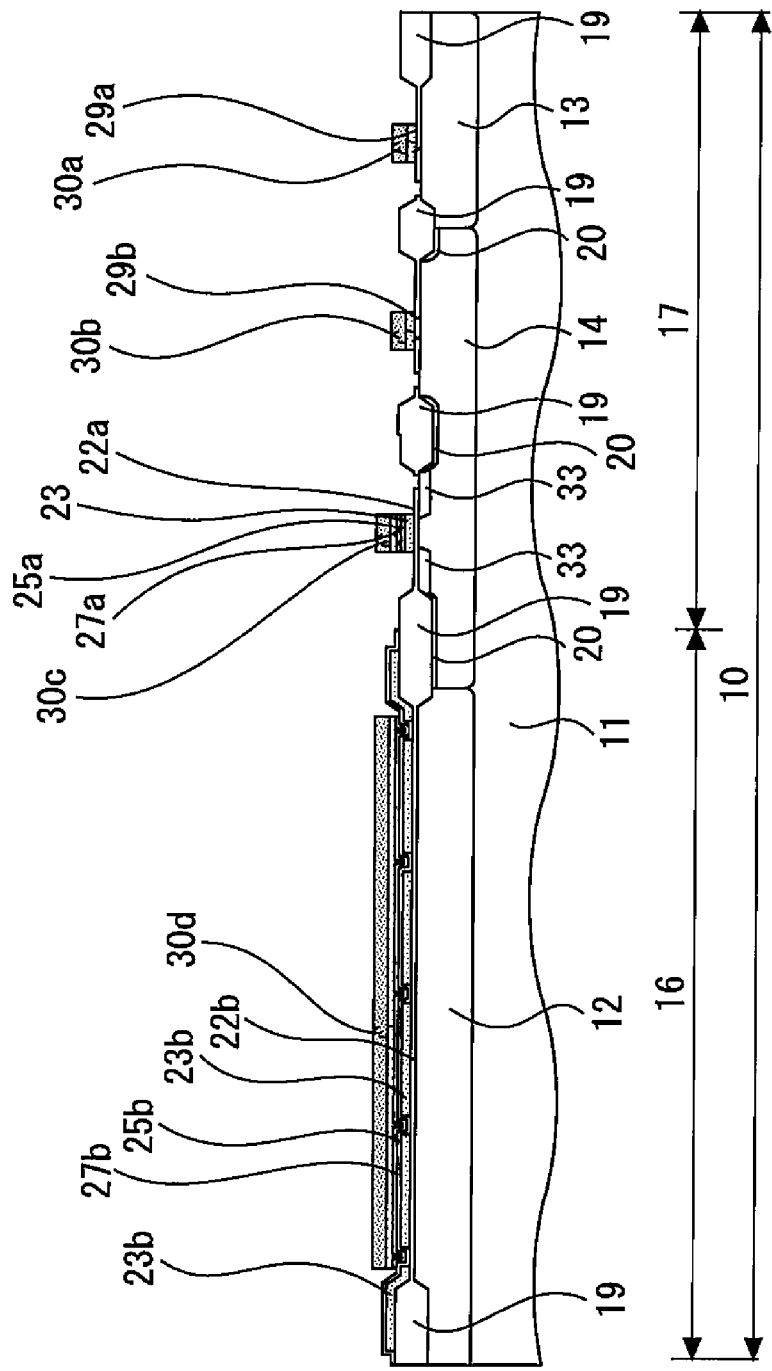

Next, as shown in FIG. 6, a first source-drain region 33 is formed by injecting n-type impurity (e.g., phosphor) using the EPROM gate electrode as an injection mask. Next, a resist mask (not shown) is formed to pattern the gate electrode of a p-channel type MOS transistor, and the gate electrode and the movable electrode of an n-channel type MOS transistor. By applying etching processing to the conductive film 30 using this resist mask as an etching mask, a gate electrode 30a of the n-channel type MOS transistor and a gate electrode 30b of the p-channel type MOS transistor are patterned in the MOS region 17. On the other hand, a movable electrode 30d as a diaphragm is patterned in the pressure sensor region 16. After removing the resist mask, the first source-drain region 33 is activated by applying heat treatment under a predetermined condition.

Figure 7:
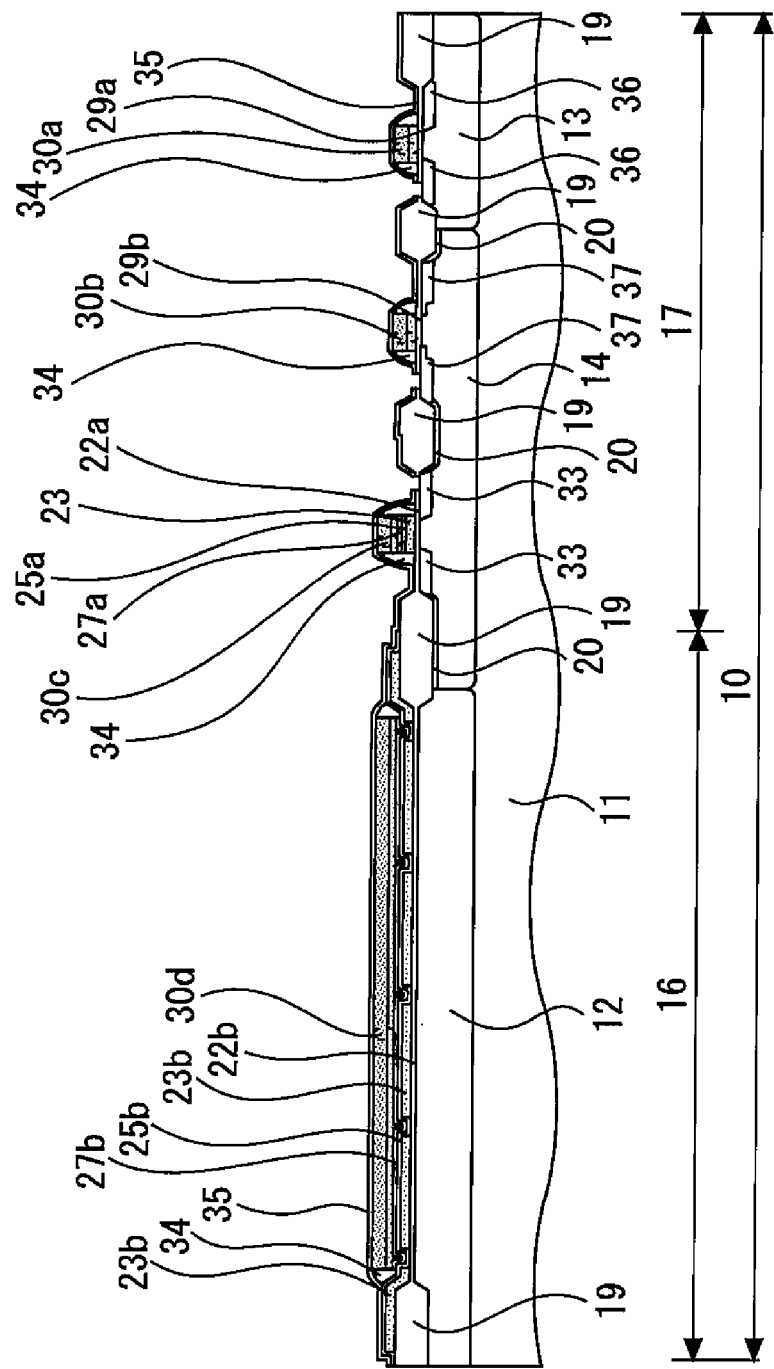

Next, a resist mask (not shown) is formed to expose only the portion in which the n-channel type MOS transistor is formed and cover the other region. An LDD (Lightly Doped Drain) region is formed as shown in FIG. 7 using this resist mask and the gate electrode 30b as injection masks and injecting n-type impurity (e.g., phosphor). After that, the resist mask is removed. Next, for example, a TEOS (Tetra Ethyl Ortho Silicate) film (not shown) is formed so as to cover the gate electrodes 30a, 30b and 30c, and the movable electrode 30d. By applying anisotropic dry etching processing to the entire surface of this TEOS film, sidewall oxide films 34 are formed on the sidewall surfaces of the gate electrodes 30a, 30b and 30c and the sidewall surface of the movable electrode 30d respectively. This reduces height differences in the periphery of the movable electrode 30d.

Next, in the well region 14, a resist mask (not shown) is formed to expose the portion in which the n-channel type MOS transistor is formed and cover the other region. A second source-drain region 37 is formed using this resist mask and the gate electrode 30b as injection masks and injecting n-type impurity (e.g., phosphor). After that, the resist mask is removed. Next, a resist mask (not shown) is formed to expose the region in which the p-channel type MOS transistor is formed in the well region 13 and cover the other region. A third source-drain region 36 is formed using this resist mask and the gate electrode 30a as injection masks and injecting p-type impurity. After that, the resist mask is removed.

Next, the second source-drain region 37 and the third source-drain region 36 are activated by applying annealing processing under a predetermined condition. Next, a silicon oxide film 35 is formed so as to cover the gate electrodes 30a, 30b and 30c, and the movable electrode 30d using, for example, a CVD method.

Figure 8:
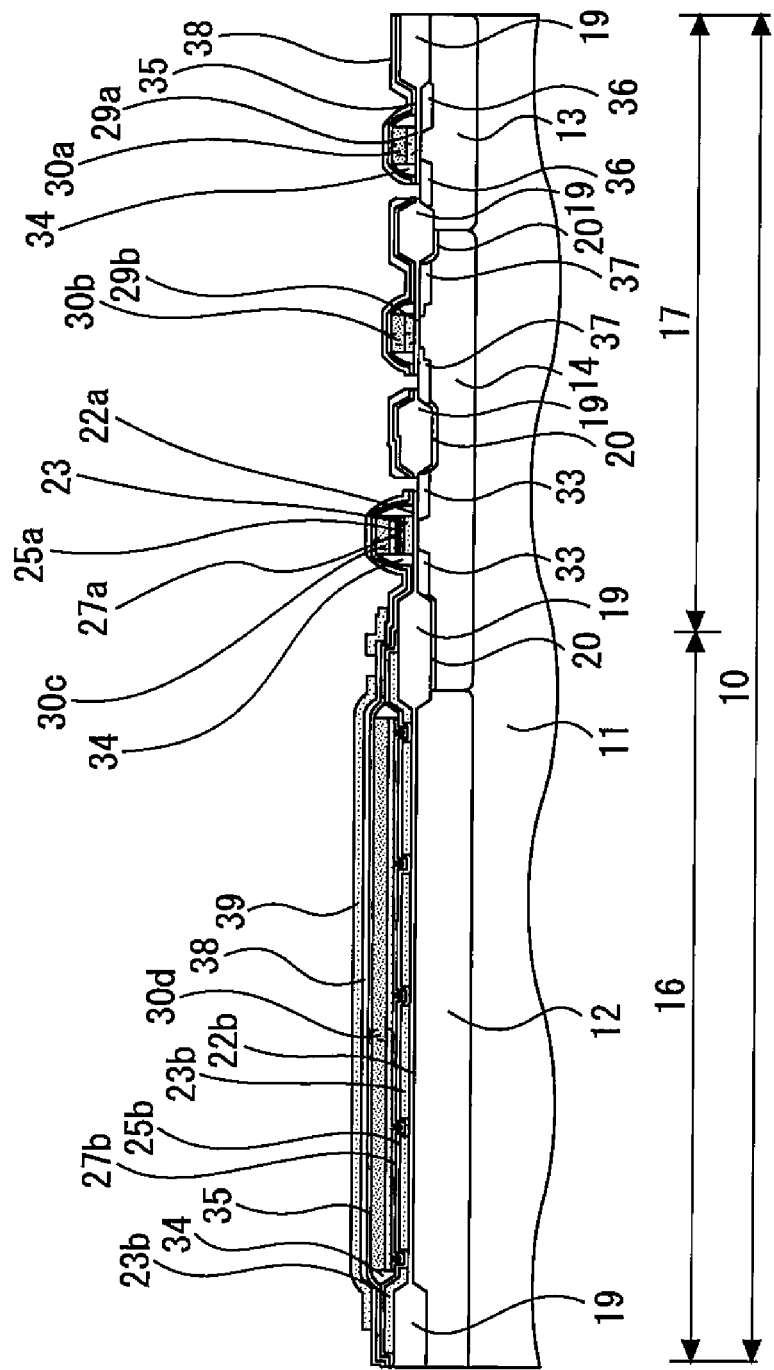

Next, as shown in FIG. 8, a TEOS-based oxide film 38 is formed so as to cover the silicon oxide film 35. A conductive polysilicon film (not shown) which becomes a shield film is formed so as to cover this oxide film 38 using a CVD method. This polysilicon film is converted to an n-type polysilicon film by introducing phosphor during or immediately after the formation of the polysilicon film using a well-known method.

Next, the exposed polysilicon film is removed by applying photoengraving processing thereto and a shield film 39 that covers the movable electrode 30d is formed. After that, the resist mask is removed. At this time, since height differences in the periphery of the movable electrode 30d are reduced by the sidewall oxide films 34, it is possible to prevent wire breakage of the shield film 39 due to cracks or insufficient coverage and increase the degree of freedom in setting the film thickness of the shield film.

In the pressure sensor region 16, the sum total of respective film thicknesses of the first movable electrode protective film 25b, the second movable electrode protective film 27b, the movable electrode 30d, the oxide films 35 and 38, and the shield film 39 is a film thickness of a diaphragm of the pressure sensor and this thickness determines a sensitivity characteristic with respect to a change in an external pressure.

Thus, the first movable electrode protective film 25b, the second movable electrode protective film 27b and the movable electrode 30d in the pressure sensor region 16, and the second gate oxide film 25a, the first silicon nitride film 27a and the gate electrodes 30a, 30b and 30c in the MOS region 17 are formed simultaneously. The same heat treatment condition is also applied to both regions. Although there is a constraint on a drastic change as the pressure sensor, a change can be made in accordance with the specification of a semiconductor element such as a MOS transistor formed in the MOS region.

Furthermore, by adjusting respective film thicknesses and forming methods of the shield film 39 and the oxide film 38, it is possible to control the sensitivity characteristic with respect to an initial capacitance value (amount of warpage of the movable electrode 30*d*) of the movable electrode 30*d*. Furthermore, the sensitivity characteristic with respect to a pressure can also be controlled. The film thickness of the shield film 39 is on the order of 50 to 1000 nm.

Since the shield film 39 covers the movable electrode 30*d* via the oxide film 38, it is possible to prevent the movable electrode 30*d* form directly contacting the outside. In addition, by connecting the shield film 39 to a grounding potential, it is possible to block influences of charge or the like from the outside and reduce characteristic variations of the pressure sensor. Note that in the case of a pressure sensor not requiring high accuracy, the shield film 39 may be omitted. In this case, the dedicated step of the pressure sensor region may be omitted.

Figure 9:
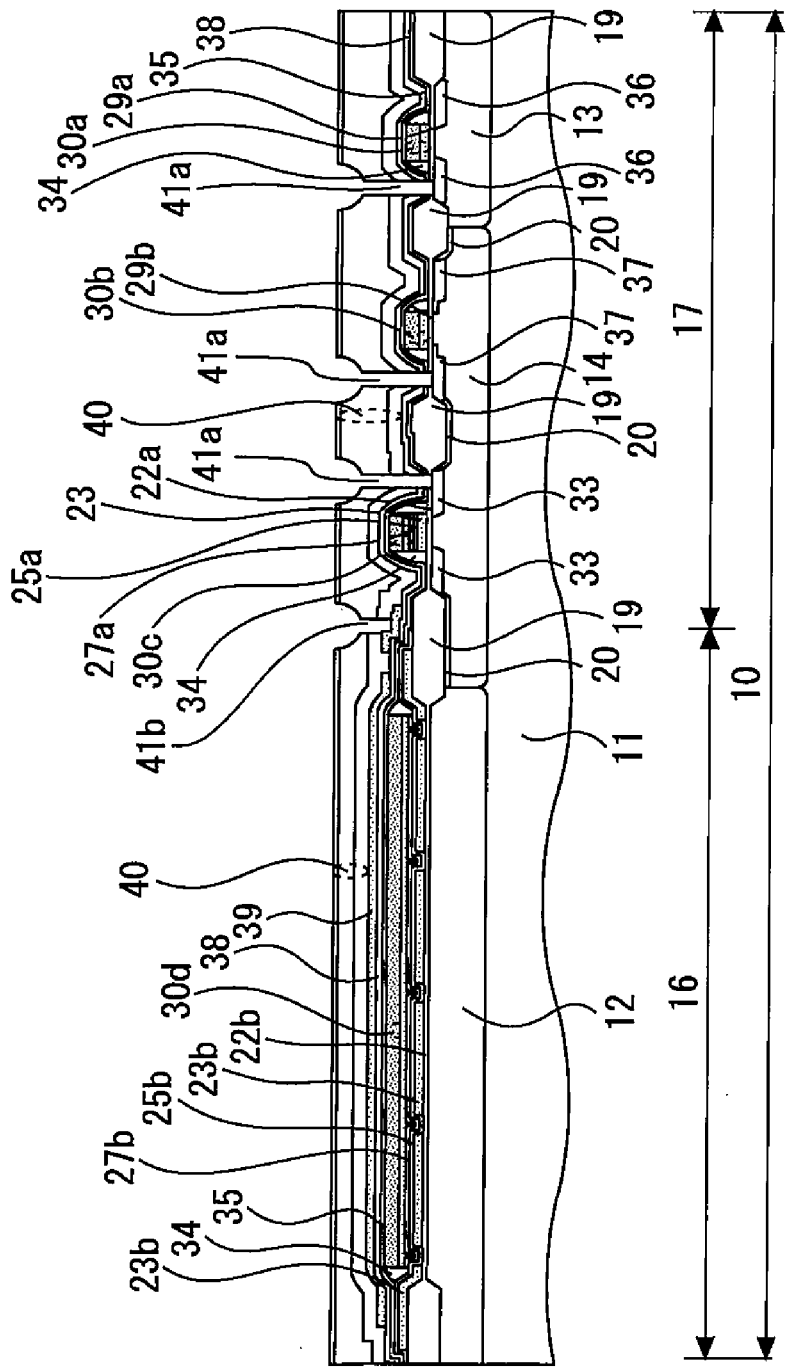

Next, as shown in FIG. 9, an inter-layer insulating film 40 is formed so as to cover the oxide film 38 and the shield film 39. The inter-layer insulating film 40 has a laminated structure of a TEOS film 40*a*, a BPSG (Boron Phosphorus Silicate Glass) film 40*b* and a TEOS film 40*c*. As the inter-layer insulating film 40, other oxide films may be applied without being limited to these films. Etch back processing of the BPSG film 40*b* may also be performed on the inter-layer insulating film 40 as flattening processing. In addition, CMP (Chemical Mechanical Polishing) processing may also be performed.

Next, a resist mask (not shown) is formed to form a contact hole through photoengraving processing. Using this resist mask as an etching mask, etching processing is performed under a condition conforming to the specification of the semiconductor element formed in the MOS region 17. Thus, contact holes 41*a* which penetrate the inter-layer insulating film 40 or the like to expose the first source-drain region 33, the second source-drain region 37 and the third source-drain region 36 are formed in the MOS region 17. On the other hand, in the pressure sensor region 16, a contact hole 41*b* that exposes the shield film 39 is formed. A well region 12 (not shown) which becomes a fixed electrode of the pressure sensor region 16 and a contact hole of the movable electrode 30*d* are also formed simultaneously. After that, the resist mask is removed.

As etching processing, wet etching and dry etching may be combined to form the contact holes 41*a* and 41*b*. In this case, the contact holes 41*a* and 41*b* have a shape which expands toward the top of the opening. Moreover, the contact holes 41*a* and 41*b* may also be formed by only dry etching.

Figure 10:
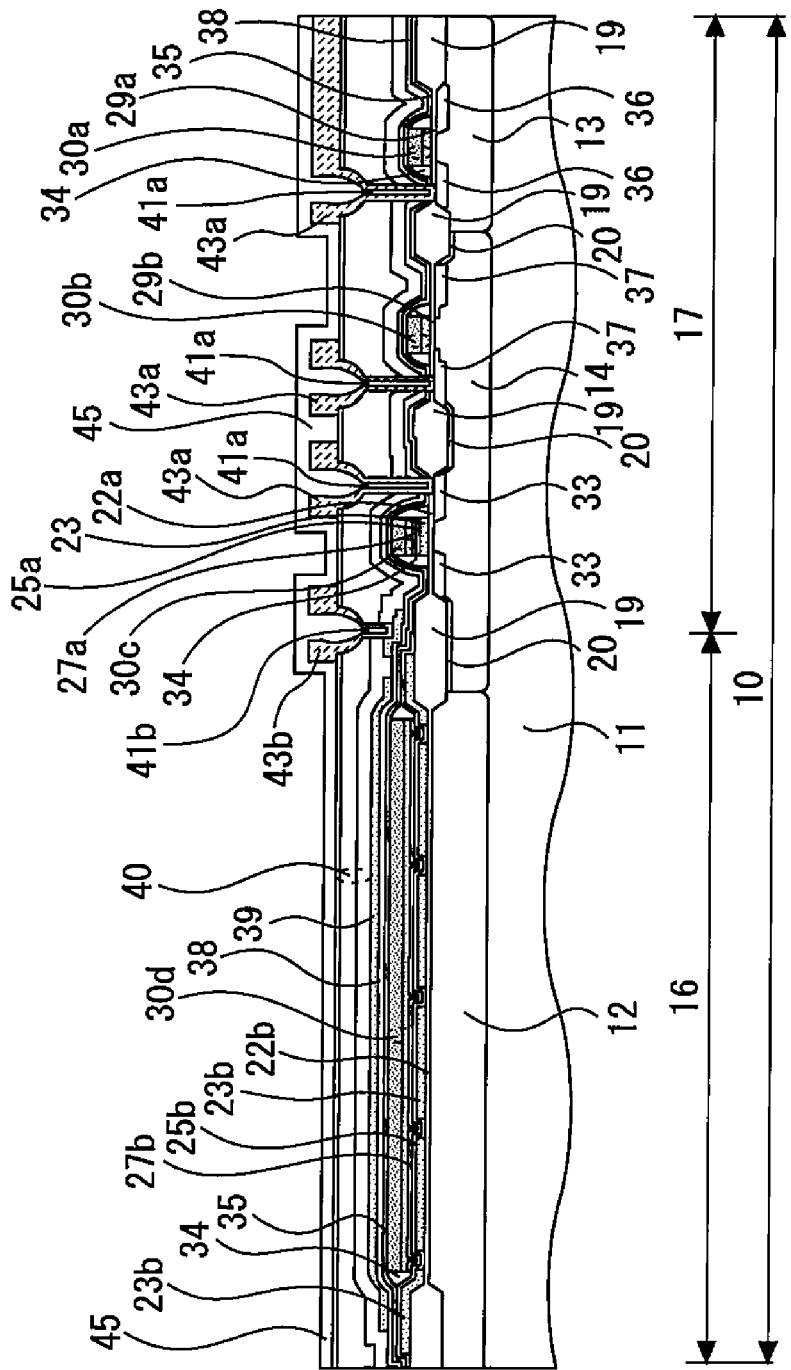

Next, as shown in FIG. 10, first wirings 43*a* and 43*b* using a metal film are formed. More specifically, a barrier metal film and an aluminum silicon copper (AlSiCu) film (neither is shown) are formed so as to cover the inter-layer insulating film 40. As the barrier metal film, for example, a titanium nitride (TiN) film is used. By patterning this aluminum silicon copper or the like, the first wiring 43*a* is formed in the MOS region 17 and the wiring 43*b* is formed in the pressure sensor region 16. More specifically, a resist mask is formed on the aluminum silicon copper, and using the resist mask as an etching mask, etching processing is applied to the aluminum silicon copper and the barrier metal film. After that, the resist mask is removed and the first wirings 43*a* and 43*b* are thereby formed. The first wiring 43*a* is electrically connected to the first source-drain region 33, the second source-drain region 37 and the third source-drain region 36. The wiring 43*b* is electrically connected to the shield film 39, the well region 12 that becomes the fixed electrode (not shown) of the pressure sensor region 16 and the movable electrode 30*d*.

For the first wirings 43*a* and 43*b*, a tungsten plug may be formed in the contact holes 41*a* and 41*b*, and a barrier metal and an aluminum copper (AlCu) film may be then formed and patterned. Barrier metals appropriate for such a configuration are, for example, titanium silicide ($TiSi_2$) or cobalt silicide ($CoSi_2$) film.

Next, an inter-layer insulating film 45 is formed so as to cover the first wirings 43*a* and 43*b*. The inter-layer insulating film 45 is formed under a condition conforming to the specification of a semiconductor element formed in the MOS region 17. For the inter-layer insulating film 45, an LTO (Low Temperature Oxide) film, for example, is suitable. A laminated structure including an SOG (Spin on Glass) film may be adopted for flattening. Moreover, CMP processing may be applied as in the case of the inter-layer insulating film 40. This inter-layer insulating film 45 becomes a surface protective film for the pressure sensor region 16 and the MOS region 17 during sacrificial film etching in a post-process.

Figure 11:
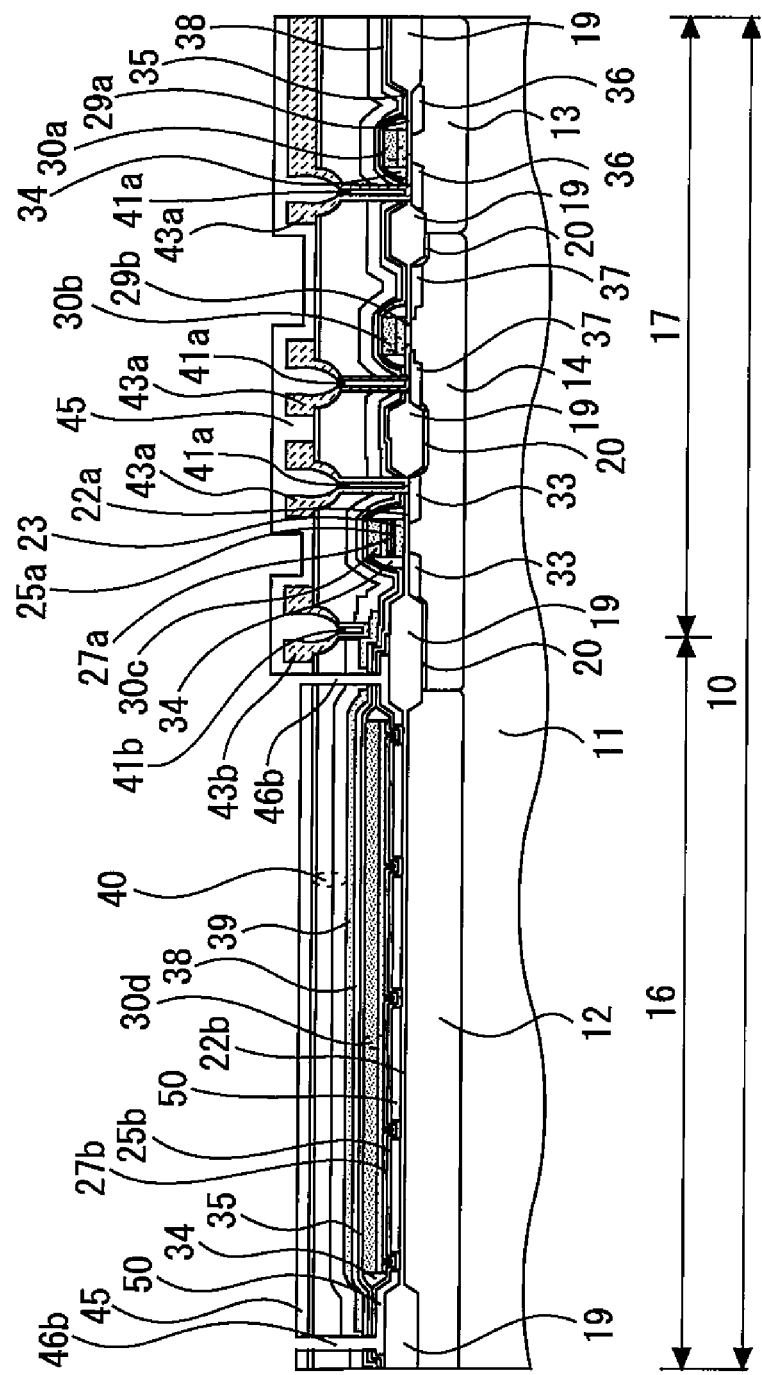

Next, by applying photoengraving processing, a resist mask (not shown) is formed to form an etching hole 46*b* shown in FIG. 11. The etching hole 46*b* is formed by applying etching processing to the insulating films such as the inter-layer insulating films 40 and 45 using this resist mask as an etching mask. After that, the resist mask is removed. Note that by forming the etching hole 46*b* on the field oxide film 19, a process margin during sacrificial film etching improves.

Next, as shown in FIG. 11, an etchant is introduced through the etching hole 46*b*, the sacrificial film 23*b* made of a polysilicon film is removed by etching and a void 50 is formed. As a chemical solution for this etching processing, for example, TMAH (Tetra Methyl Ammonium Hydroxide) of a wet etchant is used. Since TMAH has a selection ratio of polysilicon of the sacrificial film 23*b* and the inter-layer insulating film 45 of as high as 5000 to 10000 or above, elements in the MOS region 17 and the pressure sensor region 16 can be protected by the inter-layer insulating film 45 formed in a process conforming to the specification of the elements in the MOS region 17. Note that the sacrificial film 23*b* may be etched by dry etching using $XeF_2$ (xenon difluoride) or the like. Moreover, by forming the etching holes 46*b* at mutually opposing both ends of the movable electrode 30*d*, it is possible to shorten the sacrificial film etching time.

The inter-layer insulating film 45 formed in the process conforming to the specification of the element in the MOS region 17 is used to protect the element in the MOS region 17 and the pressure sensor region 16 when etching the sacrificial film 23*b*. This allows standardization with the CMOS process and makes it possible to realize heat treatment to the MOS region 17 and prevent process damage of dry etching or the like. This facilitates manufacturing of a semiconductor device and prevents characteristic deterioration.

Figure 12:
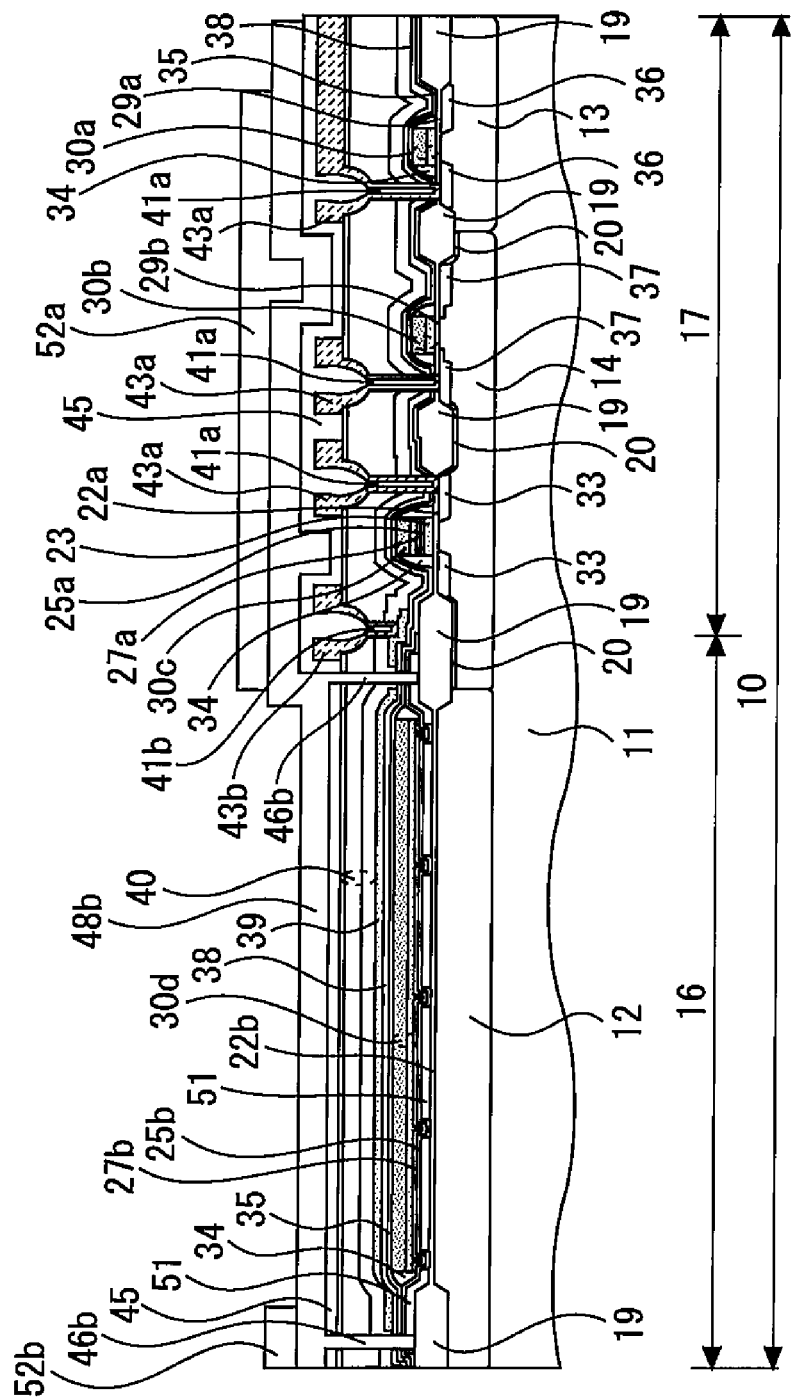

Next, as shown in FIG. 12, the void 50 formed by removing the sacrificial film 23*b* is vacuum-sealed to be converted to a vacuum chamber 51. First, for example, using a plasma CVD method, a first sealing film 48*b* such as a plasma TEOS film is formed with a film thickness of on the order of 0.5 to 1.0 μm under a condition conforming to the specification of the semiconductor element formed in the MOS region 17 (relatively low temperature condition or the like). At this time, in order to form a film in vacuum, the void 50 is decompressed and converted to the vacuum chamber 51, and the vacuum chamber 51 is vacuum-sealed by the first sealing film 48*b*. After that, for example, using a plasma CVD method, a silicon nitride film (not shown) on the order of 0.5 to 1.0 μm which becomes a passivation film is formed so as to cover the first sealing film 48b under a condition conforming to the specification of the semiconductor element formed in the MOS region 17 (relatively low temperature condition or the like).

Next, a resist mask (not shown) is formed to expose the portion of the pressure sensor region 16 in which the movable electrode opening is formed and the portion of the MOS region in which a pad opening is formed. By applying etching processing using this resist mask as an etching mask, the silicon nitride film in the region corresponding to the movable electrode opening and the pad opening is removed. In this way, a passivation film 52a is formed in the MOS region 17 and a second sealing film 52b for sealing the etching hole 46b is formed in the pressure sensor region 16. This causes the vacuum chamber 51 to be double-sealed with the first sealing film 48b and the second sealing film 52b, enabling vacuum sealing with high reliability.

Commonality with the CMOS process is made possible by forming the first sealing film 48b and the second sealing film 52b of the pressure sensor region 16 in the process conforming to the specification of the element of the MOS region 17. Moreover, it is possible to prevent process damage in heat treatment, dry etching or the like to the MOS region 17, facilitate manufacturing of the semiconductor device and prevent characteristic deterioration.

Figure 13:
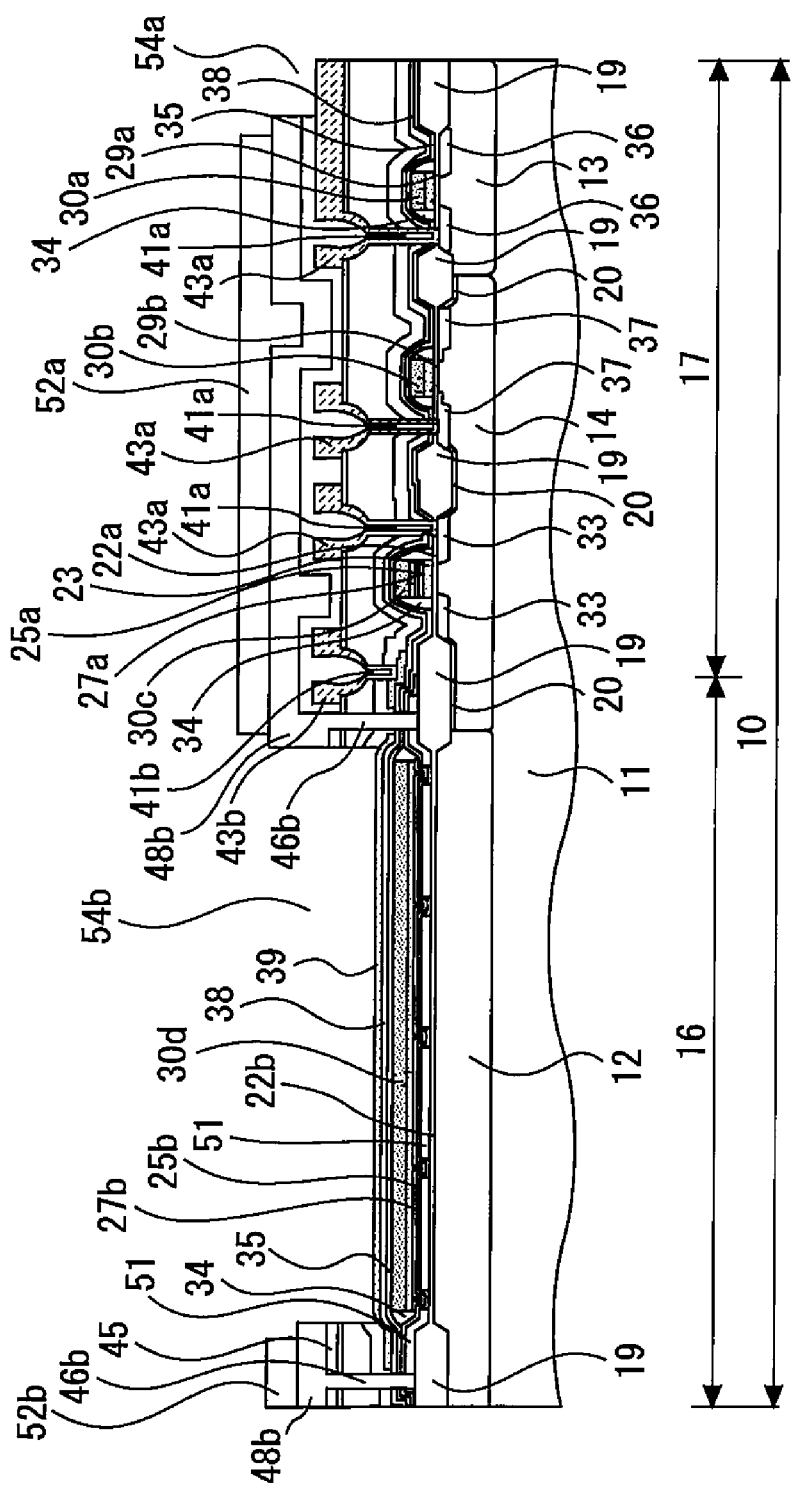

Next, as shown in FIG. 13, a movable electrode opening 54b is formed in the pressure sensor region 16 and a pad opening 54a is formed in the MOS region 17. More specifically, first, a resist mask (not shown) is formed to form the movable electrode opening 54b in the pressure sensor region 16 and the pad opening 54a in the MOS region 17. Using this resist mask as an etching mask, dry etching processing or etching processing that combines wet etching and dry etching processing is performed. Thus, by etching the inter-layer insulating films 40 and 45 on the movable electrode 30d, the movable electrode opening 54b and the pad opening 54a are formed. The main parts of the semiconductor pressure sensor are thus formed.

The shield film 39 made of a conductive polysilicon film functions as an etching stopper film when the movable electrode opening 54b is formed. Furthermore, the shield film 39 protects the movable electrode 30d from etching damage.

Furthermore, since the step of removing the sacrificial film 23b and forming the void 50 and the step of sealing the etching hole 46b (vacuum chamber 51) with the first sealing film 48b are performed before forming the movable electrode opening 54b, the inter-layer insulating film 40 and the inter-layer insulating film 45 are laminated on the movable electrode 30d, and sufficient rigidity is provided on the movable electrode 30d. This prevents sticking of the movable electrode 30d in the step of forming the void 50 and the step of sealing the vacuum chamber 51. That is, this prevents the movable electrode 30d from sticking on the fixed electrode (well region 12) side under the influence of surface tension during wet etching processing.

One side of the movable electrode 30d in the pressure sensor region 16 is open to an external space via the movable electrode opening 54b. This causes the movable electrode 30d to displace in accordance with an external pressure and causes the distance (gap) between the fixed electrode (well region 12) and the movable electrode 30d to change. The semiconductor pressure sensor detects this change of distance as a change of the capacitance value to thereby measure a pressure value. Furthermore, setting the pressure of the vacuum chamber 51 located right below the movable electrode 30d to a reference pressure allows the semiconductor pressure sensor to function as an absolute pressure sensor.

The semiconductor pressure sensor is a capacitative semiconductor pressure sensor that measures a capacity change as a pressure value, and as the capacitance value, a pressure value is measured using a change of the distance between the movable electrode 30d and the fixed electrode (well region 12) as a change of the capacitance value. The capacitance value is a total capacitance value summing up a capacitance value A of the fixed electrode protective film 22b located between the fixed electrode (well region 12) and the vacuum chamber 51, respective capacitance values B and C of the first movable electrode protective film 25b and the second movable electrode protective film 27b located between the movable electrode 30d and the vacuum chamber 51, and a capacitance value D of the vacuum chamber 51. Of these capacitance values, only the capacitance value D of the vacuum chamber 51 varies depending on an external pressure, and it is therefore necessary to accurately grasp initial capacitance values (initial values) of the capacitance values A to C respectively to more accurately measure a pressure value.

However, it is difficult to grasp the initial value of the capacitance value A in the fixed electrode protective film 22b due to a variation of film thickness when forming the first gate oxide film 22a which becomes this fixed electrode protective film 22b and a variation of the amount of film reduction of the fixed electrode protective film 22b when removing the sacrificial film 23b by etching. It is also difficult to grasp the initial value of the capacitance value B due to a variation of film thickness when forming the second gate oxide film 25a which becomes the first movable electrode protective film 25b and a variation of the amount of film reduction of the first movable electrode protective film 25b when removing the sacrificial film 23b by etching. It is also difficult to grasp the initial value of the capacitance value C due to a variation of film thickness when forming the first silicon nitride film 27a which becomes the second movable electrode protective film 27b.

Figure 14:
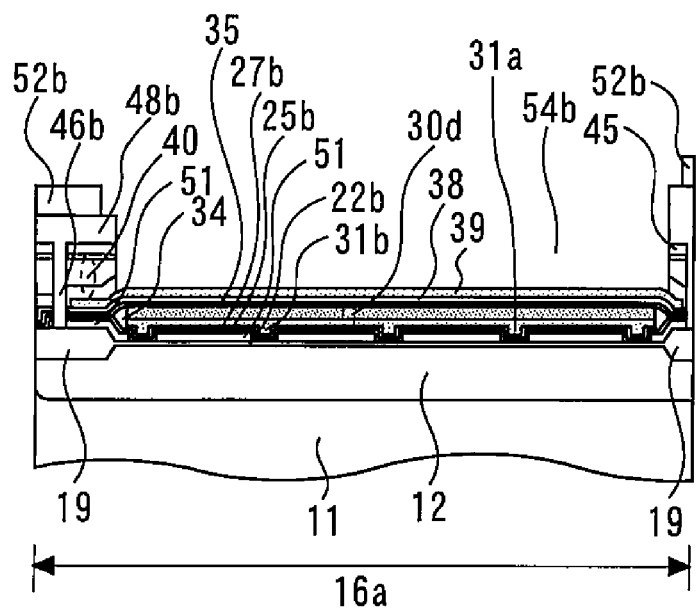
FIG. 14 is a cross-sectional view illustrating a detection pressure sensor according to an embodiment of the present invention.
Figure 15:
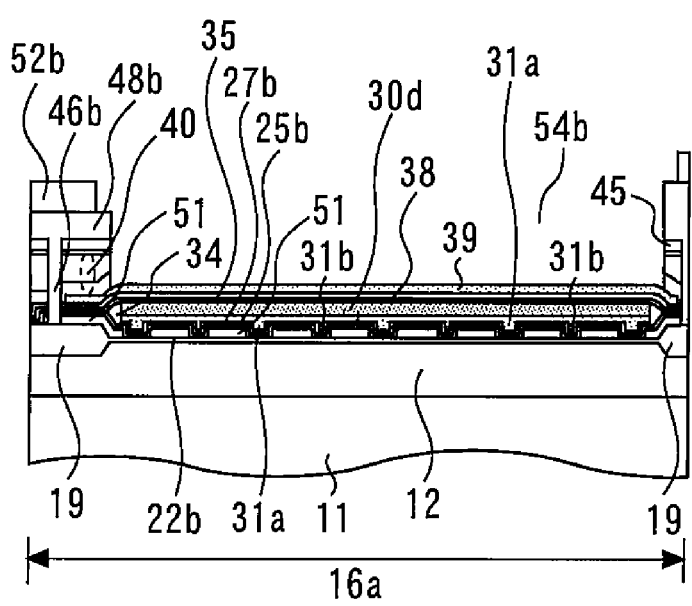
FIG. 15 is a cross-sectional view illustrating a reference pressure sensor according to an embodiment of the present invention.

FIG. 14 is a cross-sectional view illustrating a detection pressure sensor according to an embodiment of the present invention. FIG. 15 is a cross-sectional view illustrating a reference pressure sensor according to an embodiment of the present invention. To cancel variations of initial values as described above, a reference pressure sensor 16b as shown in FIG. 15 may also be provided near a detection pressure sensor 16a shown in FIG. 14. The detection pressure sensor 16a and the reference pressure sensor 16b are formed of the second well region 12, the fixed electrode protective film 22b, the movable electrode protective films 25b and 27b, the movable electrode 30d, and the vacuum chamber 51 or the like.

In the detection pressure sensor 16a, four movable electrode anchors 31a arranged in an array shape support the movable electrode 30d, whereas in the reference pressure sensor 16b, the reference electrode anchors 31b arranged between the movable electrode anchors 31a also support the movable electrode 30d. Therefore, even when an external pressure applies, the movable electrode 30d in the reference pressure sensor 16b is less likely to displace than in the detection pressure sensor 16a. Therefore, it is possible to cancel out the variation of the initial value of the capacitance value by subtracting the change of the capacitance value of the reference pressure sensor 16b from the change of the capacitance value of the pressure sensor of the detection pressure sensor 16a. This makes it possible to more accurately detect a change of the capacitance value due to an external pressure change and measure a pressure value with higher accuracy.

Figure 16:
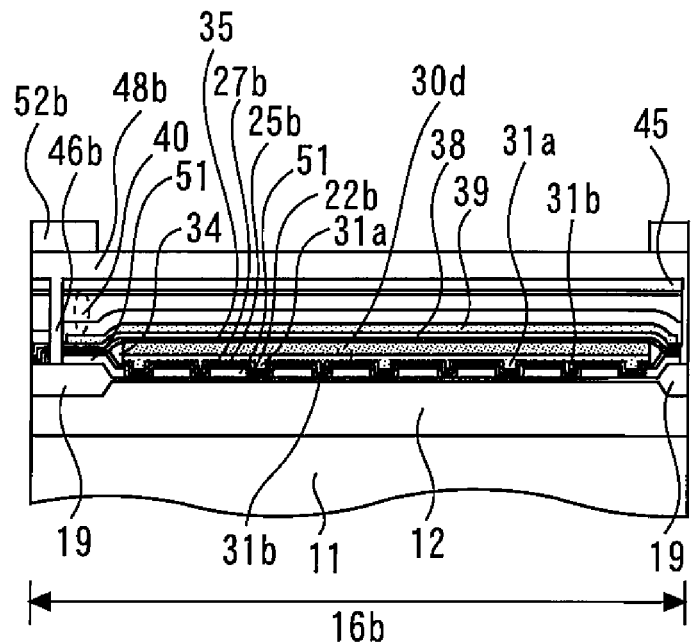
FIGS. 16 and 17 are cross-sectional views illustrating modifications of the reference pressure sensor according to the embodiment of the present invention.
Figure 17:
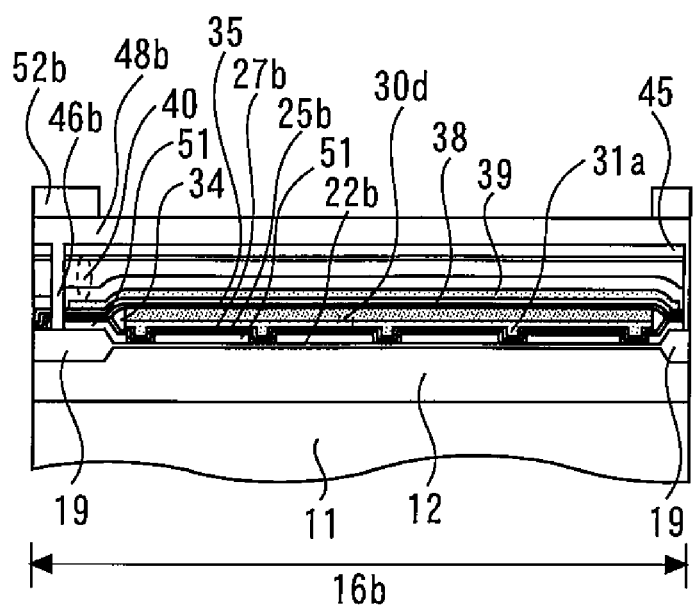

FIGS. 16 and 17 are cross-sectional views illustrating modifications of the reference pressure sensor according to the embodiment of the present invention. As shown in FIG. 14, in the detection pressure sensor 16a, the inter-layer insulating films 40 and 45 on the movable electrode 30d are left open, whereas as shown in FIGS. 16 and 17, the inter-layer insulating films 40 and 45 may remain without being opened on the movable electrode 30d in the reference pressure sensor. This makes it possible to obtain the reference pressure sensor 16b which is less likely to displace with respect to a pressure change.

Figure 18:
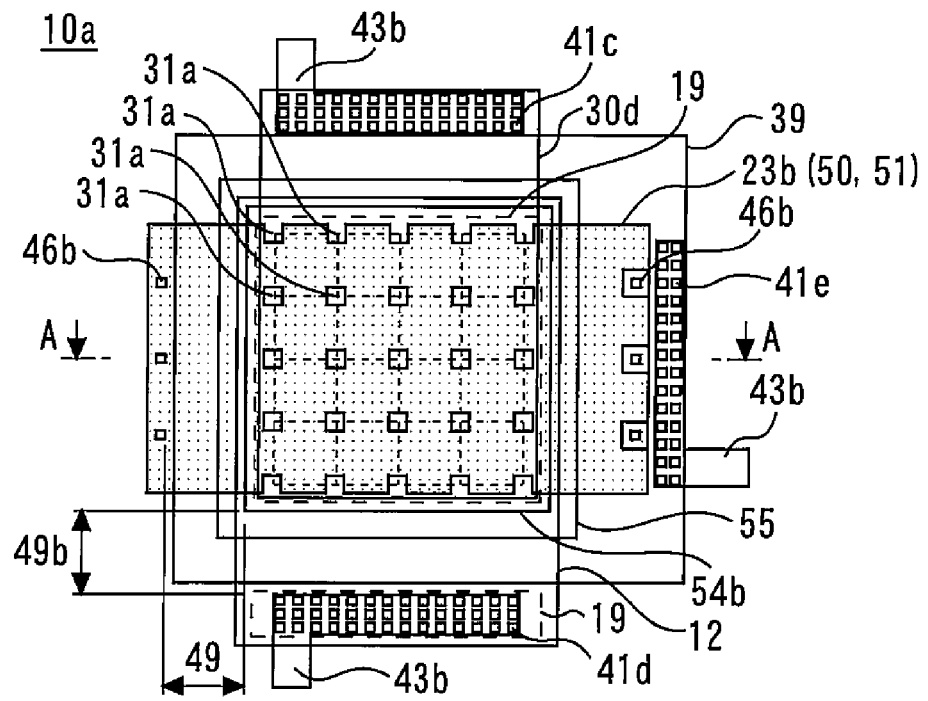
FIG. 18 is a plan view illustrating a pressure sensor region according to the embodiment of the present invention.

FIG. 18 is a plan view illustrating a pressure sensor region according to the embodiment of the present invention. The cross-sectional views of the pressure sensor region 16 in FIGS. 1 to 13 correspond to a part A-A in FIG. 18. The sacrificial film 23b of the pressure sensor is formed simultaneously with the polysilicon film of the EPROM floating gate electrode 23 (film thickness of on the order of 50 to 300 nm) of the MOS region 17. The movable electrode 30d is formed simultaneously with the gate electrode of the MOS region 17 (e.g., polysilicon film having a film thickness of on the order of 50 to 300 nm and tungsten silicide (WSi$_2$) film having a film thickness of on the order of 50 to 300 nm). Therefore, the pressure sensor region 16 is formed in the same structure as that conforming to characteristics of the element of the MOS region 17. Thus, the pressure sensor region 16 is structured to have a low void 50 which is formed by etching the sacrificial film 23b and a movable electrode 30d of a small film thickness.

Therefore, the change in capacitance between the movable electrode 30d and the well region 12 which becomes the fixed electrode with respect to a pressure change becomes too large, the linearity of a capacitance change with respect to the pressure change may deteriorate or even a small pressure change may cause the movable electrode 30d to come into contact with the fixed electrode. Therefore, the size of the movable electrode 30d needs to be reduced.

However, the initial capacitance of the pressure sensor needs to have a large value (on the order of several pF) to a certain degree to obtain the amount of capacitance change detectable from a pressure change. Thus, it is possible to form etching holes of the sacrificial film 23b and connection contact holes between the fixed electrode or movable electrode 30d and each aluminum lead wiring respectively in the small movable electrode 30d and connect the small movable electrode 30d in parallel using an aluminum wiring. However, this may increase the setup area of the pressure sensor, causing a cost increase, which is actually difficult to implement.

Therefore, forming etching holes 46b and contact holes in the movable electrode 30d, the first well 12 which becomes the fixed electrode and the shield film 39 respectively and the small movable electrodes 30d in correspondence with a movable electrode array single unit 10a in which the small movable electrodes 30d are connected and arranged in an array shape, and connecting them with an aluminum wiring can drastically reduce the arrangement area. The size of the movable electrode array single unit 10a is determined by the length of the sacrificial film 23b that can be etched and formed into the void 50 and the pressure sensor initial capacitance value required.

When the sacrificial film of the well region 12 to be the fixed electrode is etched, the protective film is the fixed electrode protective film 22b made of a film of the same material as that of the first gate oxide film 22a, and this first gate oxide film 22a is as extremely thin as on the order of 5 to 30 nm. When sacrificial film etching is performed using TMAH, if a selection ratio of the sacrificial film 23b made of a film of the same material as that of the floating gate electrode 23 and the fixed electrode protective film 22b made of a film of the same material as that of the first gate oxide film 22a is assumed to be 10000, the thickness of the fixed electrode protective film 22b is assumed to be 20 nm and the allowable amount of film reduction by sacrificial film etching is assumed to be 10 nm which corresponds to /1;2 of the initial film thickness, then a maximum width of the sacrificial film 23b within which the etching hole 46b can be formed at both ends of the sacrificial film 23b is 200 μm.

The movable electrode 30d is supported at four points by movable electrode anchors 31a inside a field region enclosed by the field oxide film 19. 4×4 movable electrodes 30d are connected and arranged in an array shape. The movable electrode anchor 31a is formed of a film of the same material as that of the movable electrode 30d by depositing the film to be the movable electrode 30d after opening the portion of the sacrificial film 23b in which the movable electrode anchor is formed.

The fixed electrode is the well region 12 formed inside the field region enclosed by the field oxide film 19. The well region 12 is formed simultaneously with the well region 13 of the MOS region 17. To secure the potential of this fixed electrode, the well region 12 is formed up to the fixed electrode contact hole 41d of the field portion enclosed by the field oxide film 19. The wiring 43b to be connected to the fixed electrode contact hole 41d is arranged at a position where the protective region 49b is provided from the movable electrode opening 54b.

The etching hole 46b which is an etchant introducing hole during etching of the sacrificial film 23b is formed on the sacrificial film 23b on the field oxide film 19 which is an extension of a sealing region 49 from the movable electrode opening 54b of a portion in which the pressure sensor capacitance is formed of an area where the first well 12 inside the field region enclosed by the field oxide film 19 and the movable electrode 30d overlap with each other. That is, the etching holes 46b which are etchant introducing holes during sacrificial film etching are formed on the field oxide film 19 at both ends of the sacrificial film 23b which becomes the void 50 (vacuum chamber 51) by sacrificial film etching. This eliminates the necessity for worrying about a film reduction of the fixed electrode protective film 22b by sacrificial film etching until sacrificial film etching reaches the inside of the field region enclosed by the field oxide film 19 in which the fixed electrode and the movable electrode 30d face each other in the vertical direction to form a pressure sensor. That is, the movable electrode array single unit 10a with a greater area can be formed.

The shield film 39 is formed so as to cover the movable electrode 30d and the well region 12 via an insulating film such as the TEOS film 38. However, the fixed electrode contact hole 41d, the movable electrode contact holes 41c, and the etching holes 46b are left open. The shield film 39 has not only an electrical shield function but also a function of protecting the movable electrode 30d during an etching process of the movable electrode opening 54b, and therefore the movable electrode opening 54b and the shield film 39 need to be designed with a sufficient margin in consideration of superimposition misalignment of a photoengraving process and the amount of side etching during opening etching. This shield film 39 is a film formed only for the pressure sensor region 16, and the film thickness and formation process can be freely set within a range that does not affect characteristics of the element of the MOS region 17. Thus, it is possible to adjust the method of forming the shield film 39 laminated on the movable electrode 30d and the film thickness, and thereby adjust the pressure sensor characteristics.

The film that becomes the movable electrode 30d is a thin film common to the gate electrode (e.g., polysilicon film (on the order of 50 to 300 nm) and tungsten silicide ($WSi_2$) film (film thickness of on the order of 50 to 300 nm)) of the MOS region 17. Therefore, the pressure sensor characteristics can be adjusted even by a tiny change of the shield film 39 formed of a conductive polysilicon film.

The inter-layer insulating film 40 (e.g., TEOS, BPSG, TEOS laminated film) used in a CMOS process as standard is laminated on the movable electrode 30d. Next, the contact holes 41a of the MOS region 17 and the contact holes 41b of the pressure sensor region 16 are formed, the first wirings 43a and 43b which become respective aluminum wirings are formed, and a film for protecting the aluminum wiring during sacrificial film etching is laminated using the inter-layer insulating film 45 with the inter-layer film (e.g., P-TEOS film or the like) used in a CMOS process as standard. After that, the etching hole 46b is opened and sacrificial film etching is performed.

Therefore, in the step of forming the vacuum chamber 51, that is, a period from sacrificial film etching to deposition of the vacuum sealing film, the thin movable electrode 30d made of a film of the same material as the gate electrode of the MOS region 17 has a structure in which the inter-layer insulating film 40 and the second inter-layer insulating film (total film thickness of on the order of 1000 to 200 nm) are laminated. Therefore, the movable electrode 30d is covered with a thick insulating film and it is possible to secure rigidity enough to prevent the movable electrode 30d from sticking to the substrate side during the step of forming the vacuum chamber 51.

In order to expose the shield film 39 on the movable electrode 30d connected and arranged in an array shape after the formation of the vacuum chamber 51, the inter-layer insulating films 40 and 45, and the first sealing film 48b are removed through the movable electrode opening 54b and the second sealing film 52b is removed through the passivation opening 55. In this case, the region from the movable electrode opening 54b to the etching holes 46b becomes the sealing region 49, and the width of this sealing region 49 becomes an important parameter to maintain the vacuum chamber 51.

Figure 19:
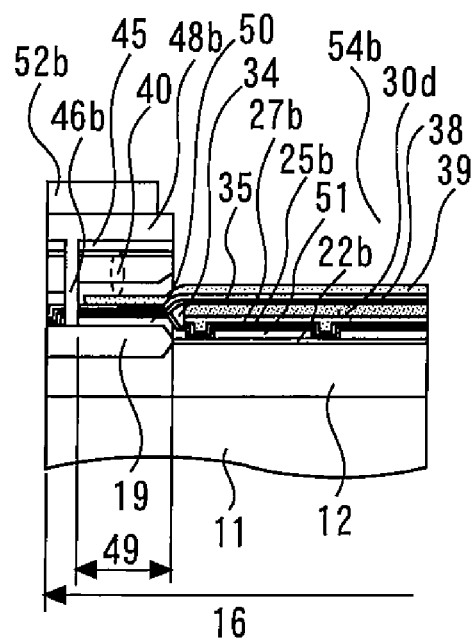
FIG. 19 is an enlarged cross-sectional view illustrating the pressure sensor region according to the embodiment of the present invention.

FIG. 19 is an enlarged cross-sectional view illustrating the pressure sensor region according to the embodiment of the present invention. The second sealing film 52b (e.g., P-TEOS) made of a film of the same material (e.g., P—SiN) as the passivation film 52a is laminated on the first sealing film 48b.

Figure 20:
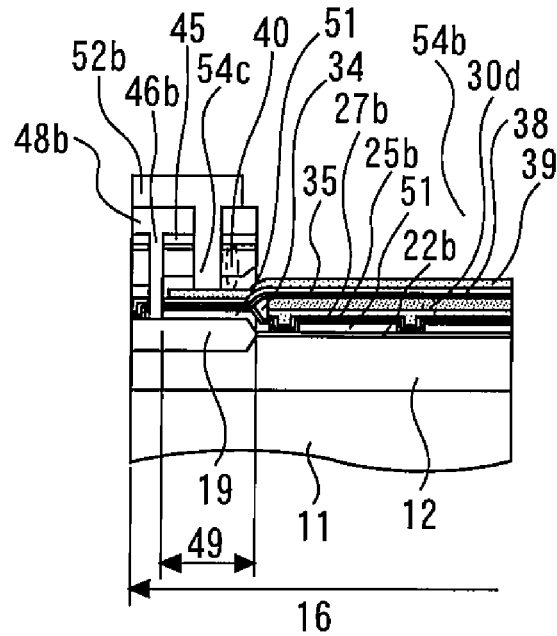
FIG. 20 is an enlarged cross-sectional view illustrating a modification of the pressure sensor region according to the embodiment of the present invention.

FIG. 20 is an enlarged cross-sectional view illustrating a modification of the pressure sensor region according to the embodiment of the present invention. The first sealing film 48b is formed on the inter-layer insulating films 40 and 45 and in the etching hole 46b. Around the etching holes 46b, the first sealing film 48b and the inter-layer insulating films 40 and 45 are etched and a sealing region opening 54c is formed. The second sealing film 52b made of a film of the same material (e.g., P—SiN) as that of the passivation film 52a is formed in the sealing region opening 54c. This allows the etching hole 46b to be enclosed by the second sealing film 52b. The passivation film 52a which becomes the second sealing film is a P—SiN film with excellent moisture resistance properties, and can thereby improve reliability of the vacuum chamber 51 and at the same time reduce the width of the sealing region 49. As a result, this reduction in chip size allows a cost reduction and improvement of reliability.

Furthermore, an opening is formed at a position of the sacrificial film 23b in which the movable electrode anchors 31a of the movable electrode 30d to be formed in a post-process are formed. In this way, a pressure sensor is formed in which the movable electrode 30d supported by four movable electrode anchors 31a is arranged in a (4×4) array in the field enclosed by the field oxide film 19.

Figure 21:
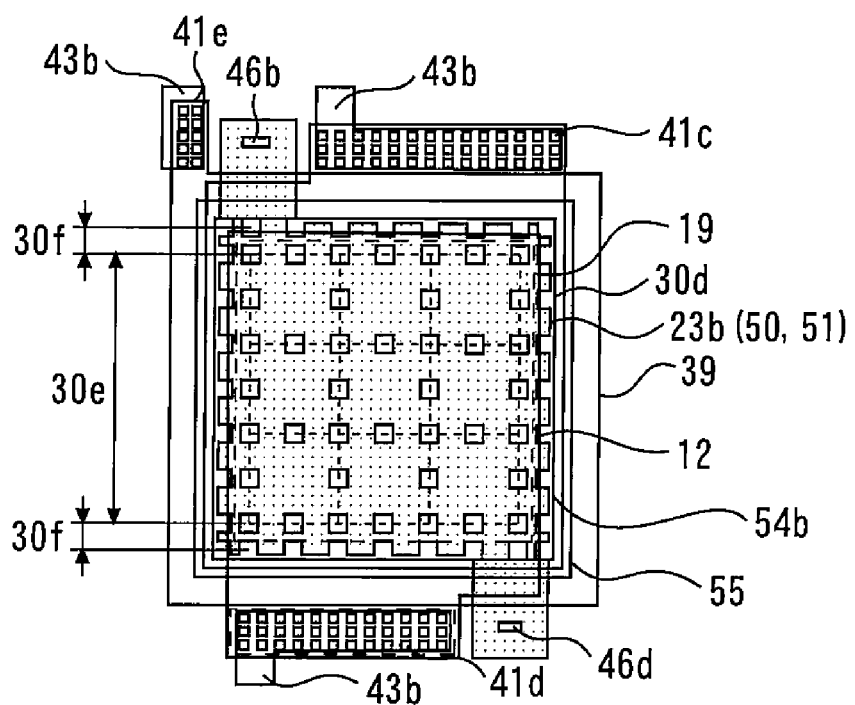
FIG. 21 is a plan view illustrating the modification of the pressure sensor region according to the embodiment of the present invention.

FIG. 21 is a plan view illustrating the modification of the pressure sensor region according to the embodiment of the present invention. In FIG. 18, four movable electrode anchors 31a are arranged at respective vertices of the square movable electrode 30d, whereas an 8-point support structure as shown in FIG. 21 may also be adopted in which the center of each side of the movable electrode 30d is also supported by the movable electrode anchor 31a. When the movable electrode 30d of the 8-point support structure is connected and arranged in an array shape, compared to a case where the movable electrode 30d of the 4-point support structure is connected and arranged in an array shape, a capacitance change with respect to a pressure change is smaller, and therefore the area of one movable electrode 30d needs to be increased. However, the linearity of the capacitance change with respect to the pressure change improves. Furthermore, when the detection electrode and the reference electrode are considered as a pair in the actual pressure sensor configuration, it is possible, as shown in FIG. 15, to form the reference electrode less movable with respect to a pressure change by adding the reference electrode anchors 31b at the center of the movable electrode 30d. This allows a pressure sensor with higher accuracy to be formed.

Figure 22:
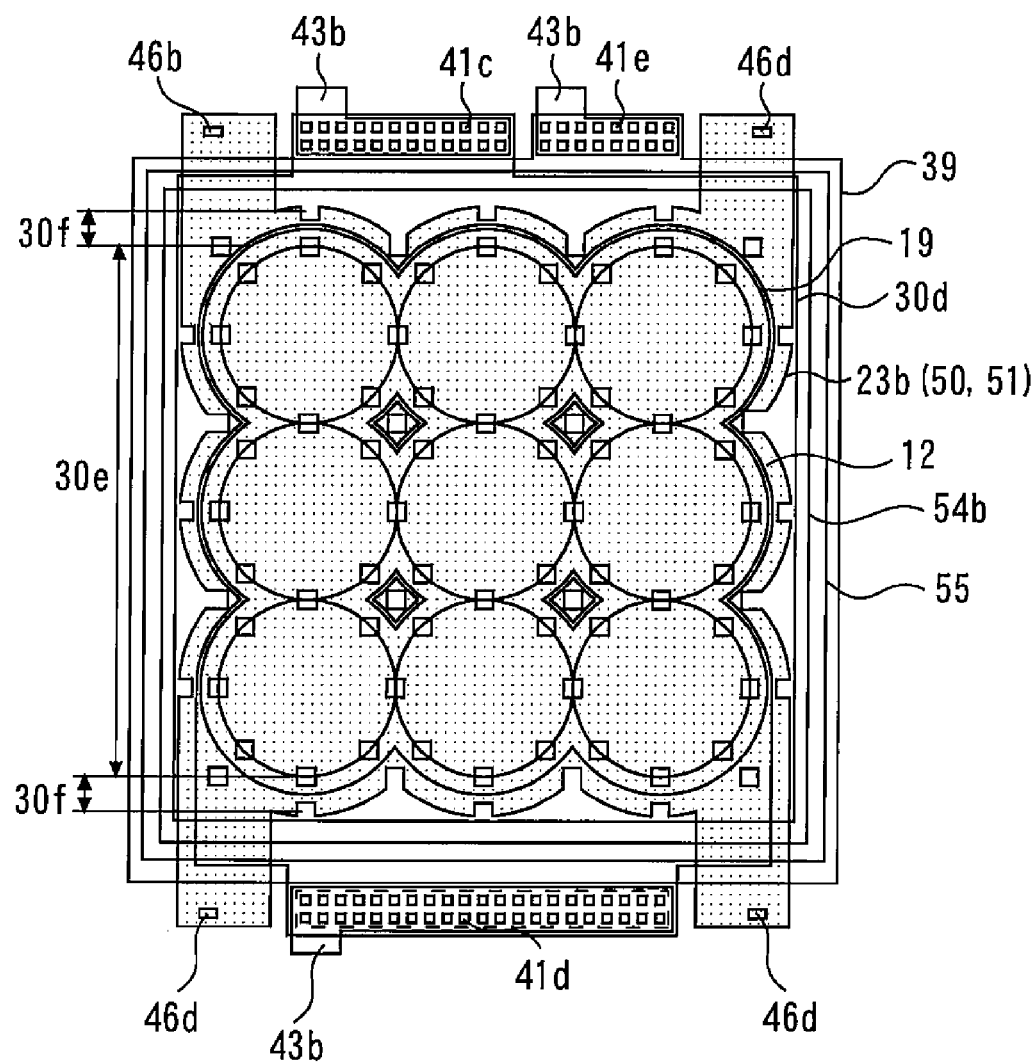
FIG. 22 is a plan view illustrating a modification of the pressure sensor region according to the embodiment of the present invention.

FIG. 22 is a plan view illustrating a modification of the pressure sensor region according to the embodiment of the present invention. The shape of the movable electrode 30d is circular. The circular movable electrode 30d is supported by eight movable electrode anchors 31a. When the circular movable electrodes 30d are arranged in an array shape, vacant regions are generated between the movable electrodes 30d, and so the arrangement area increases. However, use of the circular movable electrodes 30d improves breaking strength when an excessive pressure is applied, allowing a pressure sensor with higher reliability to be formed.

Returning to FIG. 18, the description of the shape example in which four movable electrode anchors 31a are arranged at respective vertices of the square movable electrode 30d will be continued. The movable electrode 30d is formed in the field region enclosed by the field oxide film 19. As in the case of the fixed electrode, the movable electrode 30d is formed by extending the movable electrode 30d to the movable electrode contact holes 41c on the field oxide film 19 to catch the potential of the movable electrode 30d. This movable electrode 30d is formed simultaneously with the gate electrodes 30a, 30b and 30c of the p-channel MOS transistor, n-channel MOS transistor and EPROM in the MOS region 17 respectively.

Thus, a portion where the well region 12 which becomes the fixed electrode in the field region enclosed by the field oxide film 19 and the movable electrode 30d overlap with each other via the sacrificial film 23b which becomes the void 50 (vacuum chamber 51) constitutes an pressure sensor portion whose capacitance value changes in accordance with a pressure change.

After the deposition of the inter-layer insulating film 40, the movable electrode contact holes 41c, fixed electrode contact holes 41d, sealed contact holes 41e to be electrically connected are formed in the same process as that of the element of the MOS transistor or the like of the MOS region 17. Next, the wiring 43b is formed by applying to the respective contact holes, the same process as that of the first wiring 43a of the element such as the MOS transistor of the MOS region 17.

Next, the inter-layer insulating film 45 is deposited as the protective film for the first wiring 43a, wiring 43b or the like. Next, the etching hole 46b to serve as an etchant introducing hole for etching the sacrificial film 23b is formed on the sacrificial film 23b. Next, sacrificial film etching is performed using, for example, a TMAH etchant and the sacrificial film 23b portion is converted to the void 50. Next, to convert the void 50 to the vacuum chamber 51, the first sealing film 48b is deposited under decompression to seal the etching hole 46b. The void 50 is thus converted to the vacuum chamber 51. Next, the movable electrode 30d, and the inter-layer insulating films 40 and 45, and the first sealing film 48b on the shield film 39 are opened, the movable electrode opening 54b is formed and the pressure sensor portion is made open to the outside.

Figure 23:
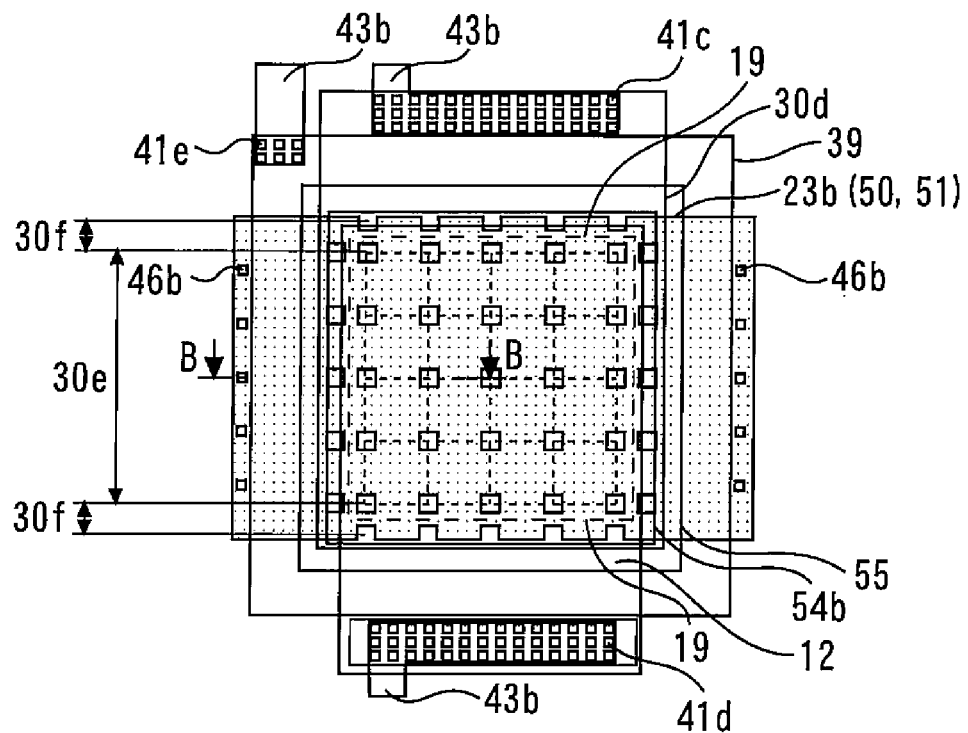
FIG. 23 is a plan view illustrating a modification of the pressure sensor region according to the embodiment of the present invention.
Figure 24:
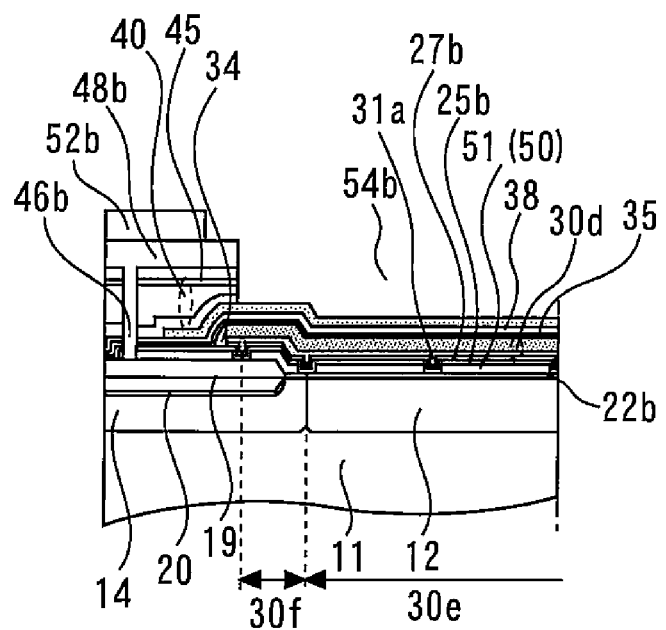
FIG. 24 is a cross-sectional view along B-B in FIG. 23.

FIG. 23 is a plan view illustrating a modification of the pressure sensor region according to the embodiment of the present invention. FIG. 24 is a cross-sectional view along B-B in FIG. 23. As in the case of the plan view in FIG. 18, the region where there is no sacrificial film 23b outside the movable electrode anchors 31a, the whole periphery of the movable electrode anchors 31a has an anchor structure. The sensitivity to a pressure of the movable electrode 30d in this region is lower than that of the movable electrodes 30d in other regions. Thus, in FIG. 23, a movable electrode compensation region 30f is formed on the perimeter of the movable electrode detection region 30e. An interval between the movable electrode anchors 31a in the movable electrode compensation region 30f is made smaller than the interval between the movable electrode anchors 31a in the movable electrode detection region 30e.

In the case of a 4-point support square movable electrode 30d, by setting the width of the movable electrode compensation region 30f to on the order of 40% of the width of one movable electrode 30d, it is possible to make sensitivities substantially equal to pressure changes in all regions of the movable electrodes 30d connected and arranged in an array shape. Furthermore, in the case of an 8-point support square movable electrode 30d, by setting the width of the movable electrode compensation region 30f to on the order of 10% of the width of one movable electrode 30d, it is possible to make sensitivities substantially equal to pressure changes in all regions of the movable electrodes 30d connected and arranged in an array shape. It is thereby possible to make uniform sensitivities to pressures of all the movable electrodes 30d connected and arranged in an array shape.

Moreover, the movable electrode compensation region 30f is a region arranged to make uniform sensitivities to pressure change of the respective movable electrodes of the movable electrode detection region 30e. Preventing the capacitance value of the movable electrode compensation region 30f from being added to the pressure sensor capacitance will improve the sensitivity to a pressure change. Thus, it is preferable to form the movable electrode compensation region 30f on the field oxide film 19 and form only the movable electrode detection region 30e on the fixed electrode (first well 12) of the field region enclosed by the field oxide film 19.

Figure 25:
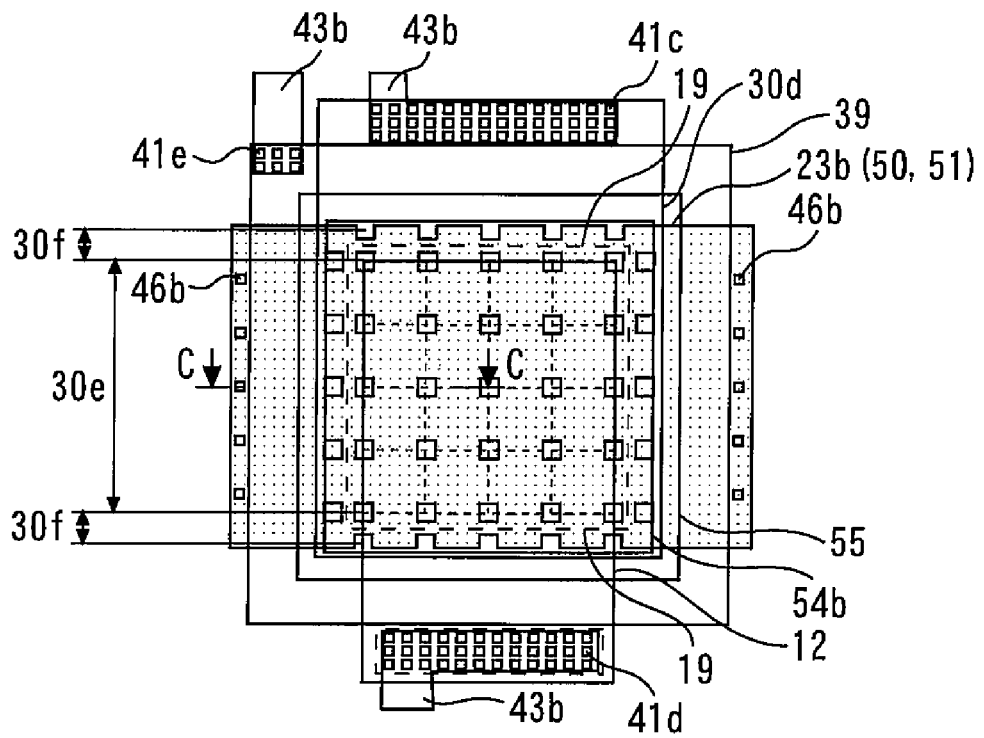
FIG. 25 is a plan view illustrating a modification of the pressure sensor region according to the embodiment of the present invention.
Figure 26:
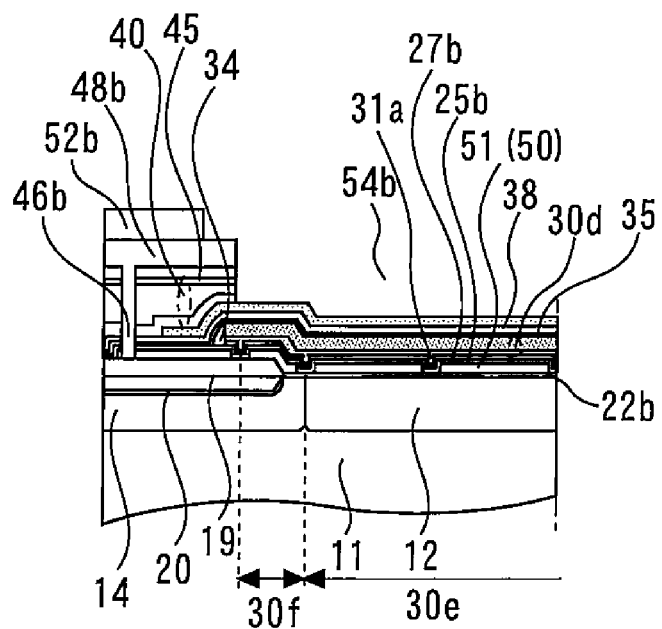
FIG. 26 is a cross-sectional view along C-C in FIG. 25.

FIG. 25 is a plan view illustrating a modification of the pressure sensor region according to the embodiment of the present invention. FIG. 26 is a cross-sectional view along C-C in FIG. 25. Thus, no well region 12 is formed right below the movable electrode compensation region 30f and the first well 12 is formed only below the movable electrode detection region 30e. This makes the sensor more susceptible to process variations, but improves sensitivity.

In the case where necessary sensitivity and initial capacitance cannot be obtained in the movable electrode array single unit 10a shown in FIGS. 18 to 26, the movable electrode array single unit 10a may be connected in parallel. In the case where the movable electrode array single unit 10a is connected in parallel, the first well 12 that becomes the fixed electrode and the movable electrode 30d are connected in parallel using the aluminum wiring 43b. In this case, vacuum-sealing each void 50 in the movable electrode array single unit 10a to form the vacuum chamber 51 may be advantageous from the standpoint of reliability when a plurality of movable electrode arrays are connected in parallel to obtain a large capacitance value change and manufacturing is also simple. More specifically, even if one movable electrode array single unit 10a malfunctions, the sensor may possibly operate. Moreover, since the sacrificial film etching time can be reduced, it is easier to shorten the manufacturing time and provide protection during sacrificial film etching.

Figure 27:
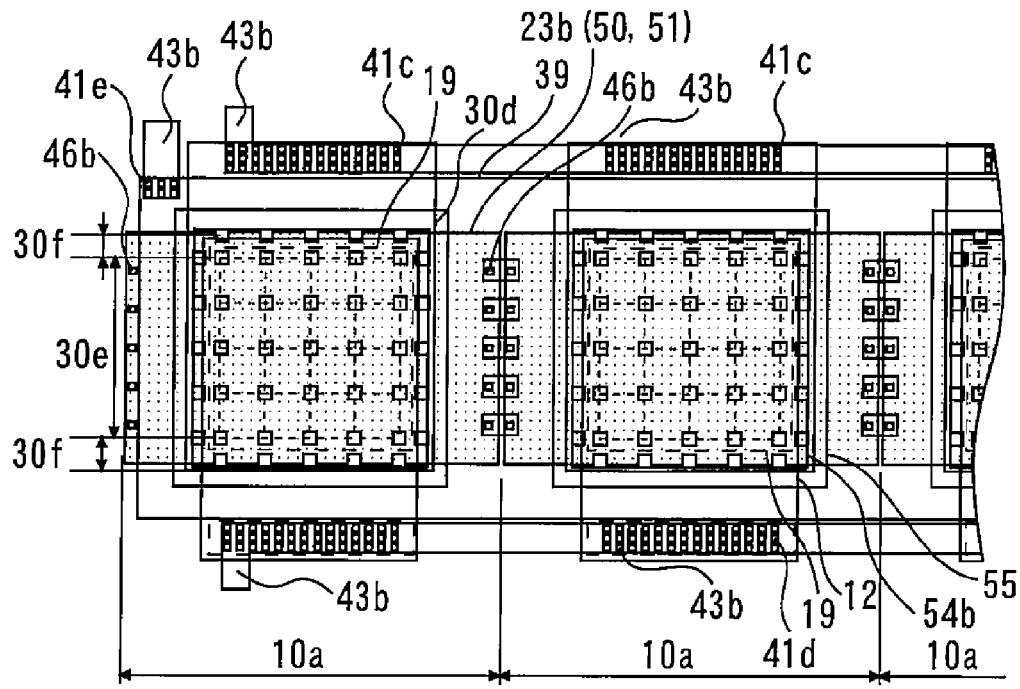
FIG. 27 is a plan view illustrating a first example of the movable electrode array single units connected in parallel.

FIG. 27 is a plan view illustrating a first example of the movable electrode array single units connected in parallel. A plurality of movable electrodes 30d and a plurality of well regions 12 which become fixed electrodes are respectively connected in parallel via wirings 43b. In this case, the sacrificial film 23b and the etching holes 46b are formed for each movable electrode array single unit 10a, and therefore even if some movable electrodes 30d are damaged and the vacuum chamber 51 is destroyed, the plurality of other movable electrode array single units 10a are connected in parallel, and so the pressure sensor functions. Reducing the size of the movable electrode array single unit 10a to increase the number of array single units connected in parallel may improve reliability and facilitate manufacturing, but this will result in an increase in both the chip area and cost. Therefore, an optimum arrangement method needs to be determined in accordance with a balance between reliability, productivity and cost.

Figure 28:
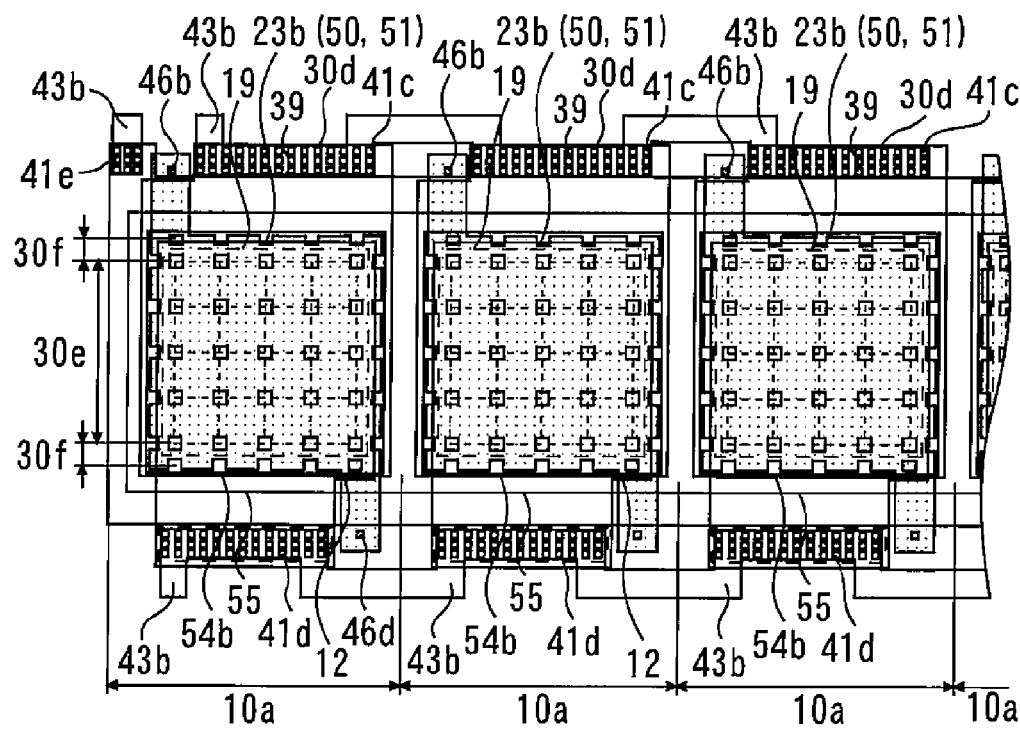
FIG. 28 is a plan view illustrating a second example of movable electrode array single units connected in parallel.
Figure 29:
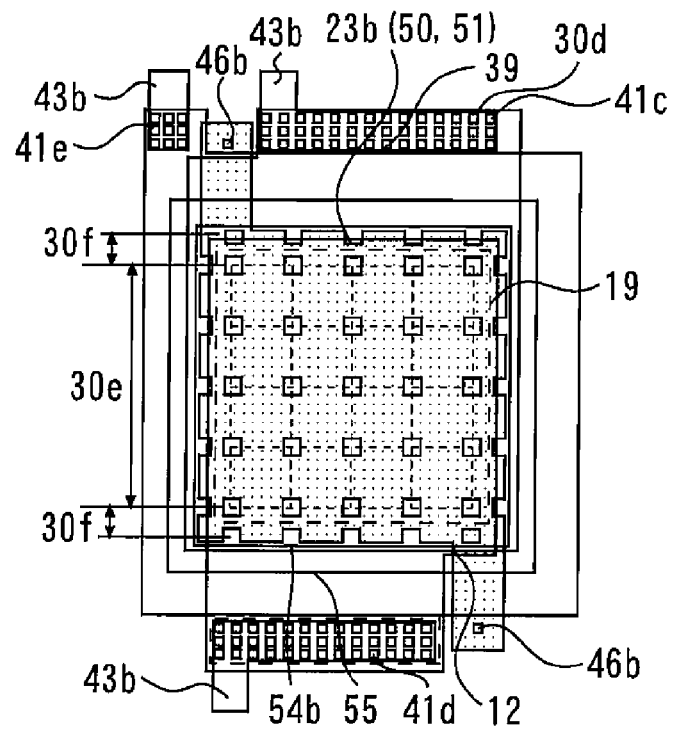
FIG. 29 is a plan view illustrating one movable electrode array single unit in FIG. 28.

FIG. 28 is a plan view illustrating a second example of movable electrode array single units connected in parallel. FIG. 29 is a plan view illustrating one movable electrode array single unit in FIG. 28. When a plurality of movable electrode array single units 10a are connected in parallel, movable electrode contact holes 41c and fixed electrode contact holes 41d which are lead wires respectively connected to the second well region 12 and the movable electrode 30d are formed at mutually opposing both ends of the movable electrode 30d to reduce the arrangement area of the pressure sensor. An etching hole 46b of the sacrificial film 23b is formed next to these lead wires. Since the etching hole 46b and the contact holes 41d are arranged in the same direction, a drastic area reduction is possible. In FIG. 29, two etching holes 46b are arranged, but four etching holes 46b may also be arranged. Arranging the etching holes 46b on a diagonal line can shorten the etching time of the sacrificial film 23b and also facilitate manufacturing.

Figure 30:
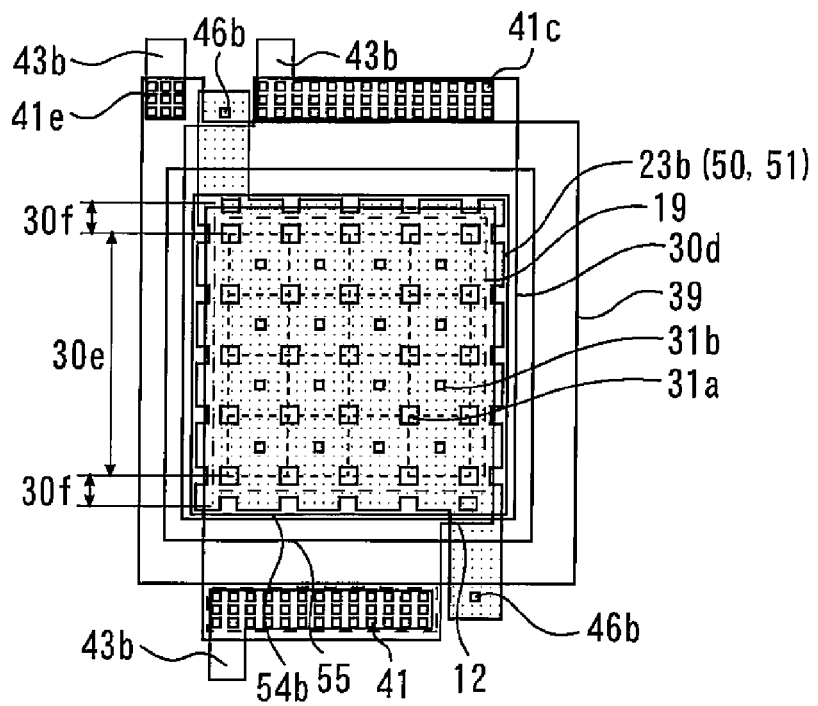
FIG. 30 is a plan view illustrating a reference pressure sensor according to the embodiment of the present invention.

FIG. 30 is a plan view illustrating a reference pressure sensor according to the embodiment of the present invention. A reference electrode anchor 31b is formed at the center of each movable electrode 30d in the square 4-point support movable electrode arranged in an array shape shown in FIG. 29 to reduce the amount of deformation of the movable electrode 30d when a pressure is applied thereto. The reference electrode anchor 31b portion is added to the detection electrode in the reference pressure sensor, and due to this structural difference, the initial capacitance value of the reference pressure sensor is greater than the initial capacitance of the detection electrode. Therefore, the area of the reference electrode anchor 31b formed at the center of the movable electrode 30d is preferably as small as possible.

Figure 31:
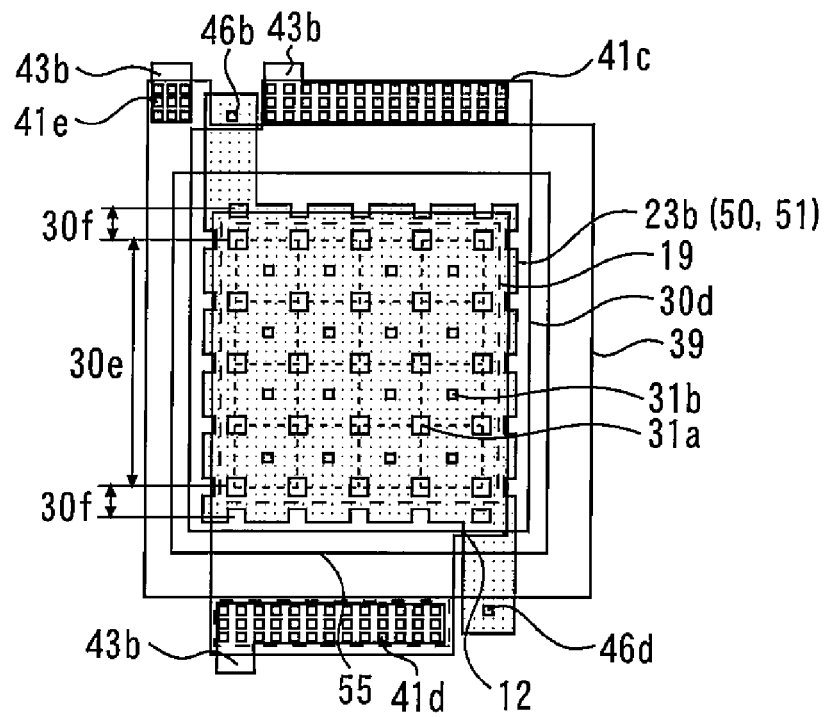
FIG. 31 is a plan view illustrating modification 1 of the reference pressure sensor according to the embodiment of the present invention.

FIG. 31 is a plan view illustrating modification 1 of the reference pressure sensor according to the embodiment of the present invention. Compared to the reference pressure sensor in FIG. 30, the inter-layer insulating films 40 and 45, and the first sealing film 48b are made to remain without forming the movable electrode opening 54b on the movable electrode 30d to further reduce the amount of capacitance change when a pressure is applied.

Figure 32:
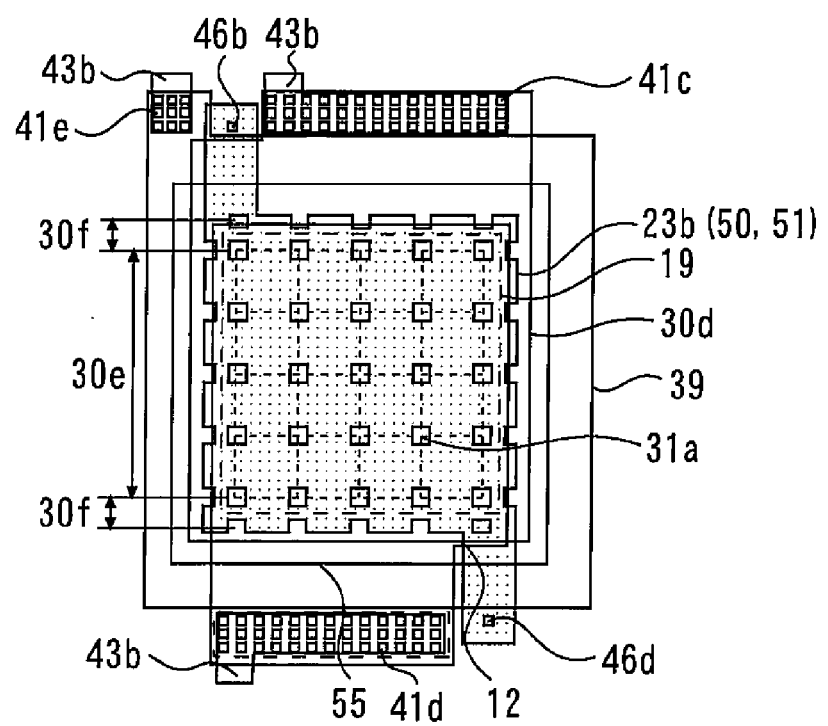
FIG. 32 is a plan view illustrating modification 2 of the reference pressure sensor according to the embodiment of the present invention.

FIG. 32 is a plan view illustrating modification 2 of the reference pressure sensor according to the embodiment of the present invention. Compared to the reference pressure sensor in FIG. 31, the reference electrode anchor 31b arranged at the center of each movable electrode 30d is eliminated, and the inter-layer insulating films 40 and 45, and the first sealing film 48b are made to remain without forming the movable electrode opening 54b on the movable electrode 30d. In this way, although the amount of capacitance change when a pressure is applied increases, the anchor layout of the movable electrode 30d remains the same as that of the detection electrode, allowing capacitance correction with high accuracy.

Figure 33:
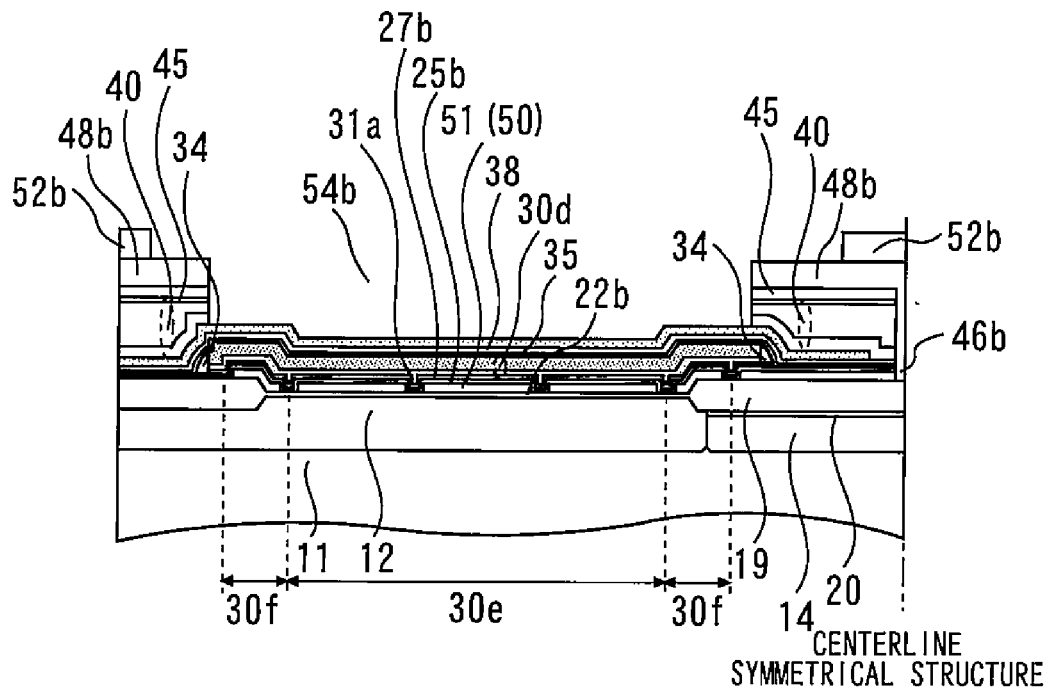
FIG. 33 is a cross-sectional view illustrating a modification of the pressure sensor region according to the embodiment of the present invention.

FIG. 33 is a cross-sectional view illustrating a modification of the pressure sensor region according to the embodiment of the present invention. An etching hole 46b is formed at one central location of a plurality of movable electrodes connected and arranged in an array shape. Arranging the etching hole 46b only at the center causes reaction of etching of the sacrificial film 23b to advance concentrically from the center, requiring twice or more the etching time compared to the case where etching holes 46b are arranged at both ends of the sacrificial film 23b. However, since vacuum sealing needs to be applied at only one location, it is possible to improve reliability and reduce the chip size.

Figure 34:
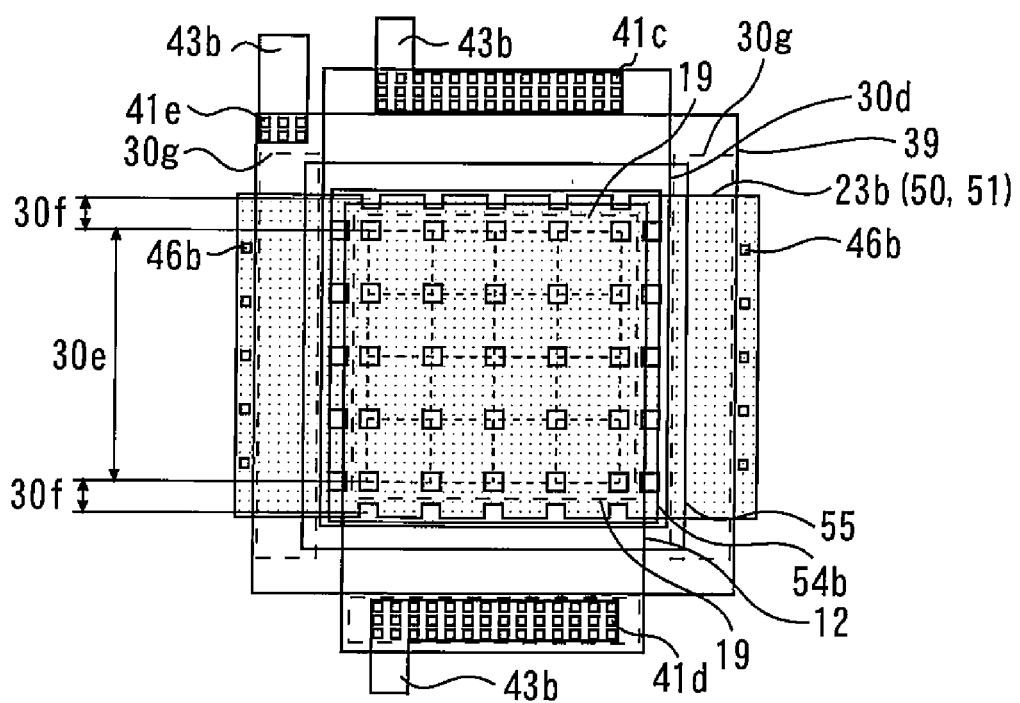
FIG. 34 is a plan view illustrating a modification of the pressure sensor region according to the embodiment of the present invention.

FIG. 34 is a plan view illustrating a modification of the pressure sensor region according to the embodiment of the present invention. Compared to the movable electrode arranged in an array layout in FIG. 23, a sacrificial film protective film 30g of the same material as that of the movable electrode 30d is formed on the sacrificial film 23b between the movable electrode 30d and the etching holes 46b simultaneously with the movable electrode 30d. This prevents the sacrificial film 23b from being thin-filmed during the process. This also allows process stabilization during etching processing of the sacrificial film 23b.

As described so far, in the present embodiment, the first well region 14 and the second well region 12 which becomes a fixed electrode are formed simultaneously on the silicon substrate 11. The first gate insulating film 22a and the fixed electrode protective film 22b are formed simultaneously on the first and second well regions respectively. The floating gate electrode 23 and the sacrificial film 23b are formed simultaneously on the first gate insulating film 22a and the fixed electrode protective film 22b respectively. The second gate insulating films 25a and 27a, and the movable electrode protective films 25b and 27b are formed simultaneously on the floating gate electrode 23 and the sacrificial film 23b respectively. The gate electrode 30c and the movable electrode 30d are formed simultaneously on the second gate insulating films 25a and 27a, and the movable electrode protective films 25b and 27b respectively. Achieving commonality between the MOS structure forming process and the pressure sensor forming process in this way can facilitate manufacturing. It is thereby possible to suppress an increase of the number of manufacturing steps and contribute to a reduction of production cost. Since there is no need to add manufacturing steps to form a semiconductor pressure sensor, and thereby prevent damage to the MOS region 17 accompanying heat treatment and damage due to dry etching or the like. Furthermore, characteristic deterioration as the semiconductor pressure sensor can be prevented.

It is further possible to form the movable electrode 30d using a thin film to form the films of the gate electrodes 30a, 30b and 30c, form the sacrificial film 23b using a thin film to form the EPROM floating gate electrode 23 and thereby form the narrow void 50 (vacuum chamber 51). This allows a semiconductor pressure sensor standardized with a small, low cost and high performance CMOS process to be formed in a simple manner.

Moreover, the sacrificial film 23b is removed with the gate electrode 30c or the like of the MOS region 17 and the movable electrode 30d or the like of the pressure sensor region 16 covered with the inter-layer insulating films 40 and 45. These inter-layer insulating films 40 and 45 are formed simultaneously in the pressure sensor region 16 and the MOS region 17. Before removing the sacrificial film 23b, this eliminates the necessity for separately forming a film to protect the pressure sensor region 16 and separately removing the protective film after removing the sacrificial film 23b. As a result, it is possible to reduce the number of manufacturing steps and reduce production costs. Moreover, the inter-layer insulating films 40 and 45 can reduce process damage to the pressure sensor region 16 and the MOS region 17. Furthermore, since the movable electrode 30d has sufficient rigidity, it is possible to prevent sticking of the movable electrode 30d in the steps of forming the void 50, vacuum-sealing the void 50 and converting the void 50 to the vacuum chamber 51.

In the pressure sensor region 16, the shield film 39 is formed on the movable electrode 30d via the insulating film 38. Covering the movable electrode 30d with the shield film 39 makes it possible to prevent direct contact with the outside. Moreover, the shield film 39 is made of a conductive polysilicon film and connected to a grounding potential. Influences of charge or the like on the movable electrode 30d from the outside can be shielded, and characteristic variations as the semiconductor pressure sensor can thereby be suppressed.

When the movable electrode opening 54b is formed by etching the inter-layer insulating films 40 and 45 on the movable electrode 30d, the shield film 39 functions as an etching stopper. This protects the movable electrode 30d from damage accompanying etching processing. Adjusting the film thickness of the shield film 39 (film thickness of the conductive polysilicon film) allows the stress characteristic and pressure detection sensitivity characteristic of the movable electrode 30d to be controlled.

Since the width of the void is small, optimizing the size of the movable electrode 30d makes it possible to provide a stopper function for preventing destruction of the movable electrode 30d when an excessive pressure is applied thereto. This makes it possible to form a semiconductor pressure sensor with high reliability.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2014-001745, filed on Jan. 8, 2014 including specification, claims, drawings and summary, on which the Convention priority of the present application is based, is incorporated herein by reference in its entirety.

What is claimed is:

1. A method for manufacturing a semiconductor device comprising:
   simultaneously forming first and second well regions on a semiconductor substrate, wherein the second well region becomes a fixed electrode;

simultaneously forming a first gate insulating film on the first well region and a fixed electrode protective film on the second well region;

simultaneously forming a floating gate electrode on the first gate insulating film and a sacrificial film on the fixed electrode protective film;

simultaneously forming a second gate insulating film on the floating gate electrode and a movable electrode protective film on the sacrificial film;

simultaneously forming a gate electrode on the second gate insulating film and a movable electrode on the movable electrode protective film;

removing the sacrificial film to form a void by;

vacuum-sealing the void to form a vacuum chamber;

forming an inter-layer insulating film covering the gate electrode and the movable electrode; and removing the sacrificial film with the gate electrode and the movable electrode covered with the inter-layer insulating film.

2. The method according to claim 1, further comprising forming a shield film connected to a grounding potential on the movable electrode via an insulating film before the inter-layer insulating film is formed.

3. The method according to claim 2, further comprising etching the inter-layer insulating film on the movable electrode to form a movable electrode opening,
wherein the shield film functions as an etching stopper when the movable electrode opening is formed.

4. A method for manufacturing a semiconductor device comprising:
simultaneously forming first and second well regions on a semiconductor substrate, wherein the second well region becomes a fixed electrode;
simultaneously forming a first gate insulating film on the first well region and a fixed electrode protective film on the second well region;
simultaneously forming a floating gate on the first gate insulating film and a sacrificial film on the fixed electrode protective film;
simultaneously forming a second gate insulating film on the floating gate electrode and a movable electrode protective film on the sacrificial film;
simultaneously forming a gate electrode on the second gate insulating film and a movable electrode on the movable electrode protective film;
removing the sacrificial film to form a void by; and
vacuum-sealing the void to form a vacuum chamber,
wherein the movable electrode is supported by a plurality of movable electrode anchors,
the movable electrode includes a movable electrode detection region and a movable electrode compensation region located on a perimeter of the movable electrode detection region, and
an interval between the movable electrode anchors in the movable electrode compensation region is smaller than an interval between the movable electrode anchors in the movable electrode detection region.

5. The method according to claim 4, further comprising forming a field oxide film around the second well region,
wherein the movable electrode compensation region is formed on the field oxide film.

6. The method according to claim 4, wherein the second well region is not formed right below the movable electrode compensation region.

7. The method according to claim 1, further comprising:
forming a field oxide film around the second well region;
forming an etching hole in the inter-layer insulating film on the field oxide film; and
introducing an etchant through the etching hole to etch and remove the sacrificial film.

8. The method according to claim 7, further comprising forming a sacrificial film protective film of a same material as a material of the movable electrode on the sacrificial film between the movable electrode and the etching holes simultaneously with the movable electrode.

9. The method according to claim 7, wherein the etching hole is formed at mutually opposing both ends of the movable electrode.

10. The method according to claim 9, comprising:
forming lead wires respectively connected to the second well region and the movable electrode are formed at mutually opposing both ends of the movable electrode; and
forming the etching hole next to the lead wires.

11. The method according to claim 7, wherein the movable electrode includes a plurality of electrodes connected and arranged in an array shape, and the etching hole is formed at one central location of the plurality of electrodes.

12. The method according to claim 7, further comprising:
forming a first sealing film on the inter-layer insulating films and in the etching hole;
etching the first sealing film and the inter-layer insulating films around the etching hole to form a sealing region opening; and
forming a second sealing film in the sealing region opening.

13. The method according to claim 1, wherein a detection pressure sensor and a reference pressure sensor are formed of the second well region, the fixed electrode protective film, the movable electrode protective film, the movable electrode, and the vacuum chamber, and
in the detection pressure sensor, the inter-layer insulating film on the movable electrode is left open.

14. The method according to claim 13, wherein the movable electrode is supported by a plurality of movable electrode anchors in the detection pressure sensor, and the movable electrode is supported by the movable electrode anchors and reference electrode anchors arranged between the movable electrode anchors in the reference pressure sensor.

15. The method according to claim 13, wherein the inter-layer insulating film remains without being opened in the reference pressure sensor.

16. The method according to claim 1, wherein the movable electrode includes a plurality of electrodes, the second well region includes a plurality of well regions, the plurality of electrodes and the plurality of well regions are respectively connected in parallel via wirings.

17. The method according to claim 1, wherein the movable electrode is circular.

* * * * *